United States Patent
Jeon et al.

(10) Patent No.: US 12,411,613 B2
(45) Date of Patent: Sep. 9, 2025

(54) NON-VOLATILE MEMORY DEVICE AND OPERATING METHOD THEREOF

(71) Applicant: Samsung Electronics Co., Ltd., Suwon-si (KR)

(72) Inventors: Young Geun Jeon, Hwaseong-si (KR); Hyung Suk Yu, Seoul (KR); Jae Yong Jeong, Yongin-si (KR); Byung Yong Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 212 days.

(21) Appl. No.: 17/968,873

(22) Filed: Oct. 19, 2022

(65) Prior Publication Data

US 2023/0152983 A1 May 18, 2023

(30) Foreign Application Priority Data

Nov. 17, 2021 (KR) .................. 10-2021-0158731
Jan. 14, 2022 (KR) .................. 10-2022-0006182

(51) Int. Cl.
*G06F 3/06* (2006.01)

(52) U.S. Cl.
CPC .......... *G06F 3/0619* (2013.01); *G06F 3/0653* (2013.01); *G06F 3/0679* (2013.01)

(58) Field of Classification Search
CPC ........... G06F 3/061; G06F 3/0619; G06F 3/06
USPC .................................................. 365/185.23
See application file for complete search history.

(56) References Cited

U.S. PATENT DOCUMENTS

| | | | |
|---|---|---|---|
| 7,940,578 B2 | 5/2011 | Kang et al. | |
| 8,526,253 B2 | 9/2013 | Pious et al. | |
| 9,330,762 B2 | 5/2016 | Namai | |
| 10,872,672 B2 | 12/2020 | Kim et al. | |
| 11,037,641 B1 | 6/2021 | Prakash et al. | |
| 11,081,185 B2 | 8/2021 | Chibvongodze et al. | |
| 2012/0257452 A1* | 10/2012 | Kim .................. | G11C 16/0466 365/185.11 |
| 2013/0135931 A1* | 5/2013 | Namai ................. | G11C 16/10 365/185.11 |
| 2020/0118629 A1* | 4/2020 | Kim ....................... | G11C 16/08 |
| 2021/0202457 A1* | 7/2021 | Choi ..................... | G11C 16/08 |
| 2023/0178165 A1* | 6/2023 | Lee .................. | G11C 29/12005 |

FOREIGN PATENT DOCUMENTS

KR 10-2012-0091686 A 8/2012

* cited by examiner

*Primary Examiner* — Muna A Techane
(74) *Attorney, Agent, or Firm* — Muir Patent Law, PLLC

(57) ABSTRACT

A non-volatile memory device includes a memory cell array including a plurality of memory cells respectively connected to a plurality of word lines; a plurality of first pass transistors each connected to one side of one of the plurality of word lines; a plurality of second pass transistors each connected to the other side of one of the plurality of word lines; a voltage generator configured to generate a plurality of operating voltages and to apply the plurality of operating voltages to the memory cell array; in response to a first switch control signal, a first switch circuit configured to connect the plurality of first pass transistors to the voltage generator; and in response to a first switch control signal, a second switch circuit configured to connect the plurality of second pass transistors to the voltage generator.

16 Claims, 17 Drawing Sheets

NON-VOLATILE MEMORY DEVICE AND OPERATING METHOD THEREOF

CROSS-REFERENCE TO RELATED APPLICATIONS

This application claims priority under 35 U.S.C. § 119 to Korean Patent Application No. 10-2021-0158731, filed on Nov. 17, 2021 and Korean Patent Application No. 10-2022-0006182 filed on Jan. 14, 2022 in the Korean Intellectual Property Office, the disclosure of each of which is incorporated herein by reference in its entirety.

BACKGROUND

1. Field of the Disclosure

The present disclosure relates to a non-volatile memory device and an operating method thereof.

2. Description of the Related Art

Semiconductor devices are manufactured by various processes. As semiconductor design technology develops, the number of processes for manufacturing semiconductors, the complexity of each process, or the degree of integration of the semiconductor devices is increasing. Accordingly, various defects or faults may occur in a semiconductor manufacturing process. Therefore, methods of detecting the various defects or faults are being studied.

SUMMARY

An aspect of the present disclosure provides a non-volatile memory device in which a voltage is applied to both sides of each of a ground selection line, a word line, and a string selection line.

Another aspect of the present disclosure provides a non-volatile memory device in which a voltage is applied to both sides of each of a ground selection line, a word line, and a string selection line to detect defects or faults.

According to an embodiment of the present inventive concept, a non-volatile memory device includes a memory cell array including a plurality of memory cells respectively connected to a plurality of word lines; a plurality of first pass transistors each connected to one side of one of the plurality of word lines; a plurality of second pass transistors each connected to the other side of one of the plurality of word lines; a voltage generator configured to generate a plurality of operating voltages and to apply the plurality of operating voltages to the memory cell array; in response to a first switch control signal, a first switch circuit configured to connect the plurality of first pass transistors to the voltage generator and to apply a corresponding first voltage of the plurality of operating voltages to the one side of one of the plurality of word lines through a corresponding one of the plurality of first pass transistors; and in response to a second switch control signal, a second switch circuit configured to connect the plurality of second pass transistors to the voltage generator and to apply the corresponding first voltage to the other side of one of the plurality of word lines through a corresponding one of the plurality of second pass transistors.

According to an embodiment of the present inventive concept, a non-volatile memory device includes a memory cell array including a plurality of memory cells respectively connected to a plurality of word lines; a voltage generator configured to generate a first operating voltage; and a switch circuit configured to apply the first operating voltage to any one of one side of one of the plurality of word lines and the other side of one of the plurality of word lines in a first mode, and apply the first operating voltage to one side of one of the plurality of word lines and the other side of one of the plurality of word lines in a second mode.

According to an embodiment of the present inventive concept, a method of operating a non-volatile memory device includes a memory cell array including a plurality of NAND strings each connected between a substrate and a plurality of bit lines, the method comprising: pre-charging a bit line corresponding to a selected NAND string among the plurality of NAND strings; providing a ground selection voltage and a string selection voltage to one side and the other side of a ground selection line corresponding to the selected NAND string and one side and the other side of a string selection line corresponding to the selected NAND string, respectively; providing a word line voltage to any one of one side and the other side of one of a plurality of word lines of the selected NAND string in a first mode, and providing the word line voltage to one side and the other side of one of the plurality of word lines of the selected NAND string in a second mode.

Still another aspect of the present disclosure provides a method of operating a non-volatile memory device in which a voltage is applied to both sides of each of a ground selection line, a word line, and a string selection line.

Yet another aspect of the present disclosure provides a method of operating a non-volatile memory device in which a voltage is applied to both sides of each of a ground selection line, a word line, and a string selection line to detect defects or faults.

Aspects of the present disclosure are not limited to the aspects mentioned above, and other technical aspects not mentioned above will be clearly understood by those skilled in the art from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
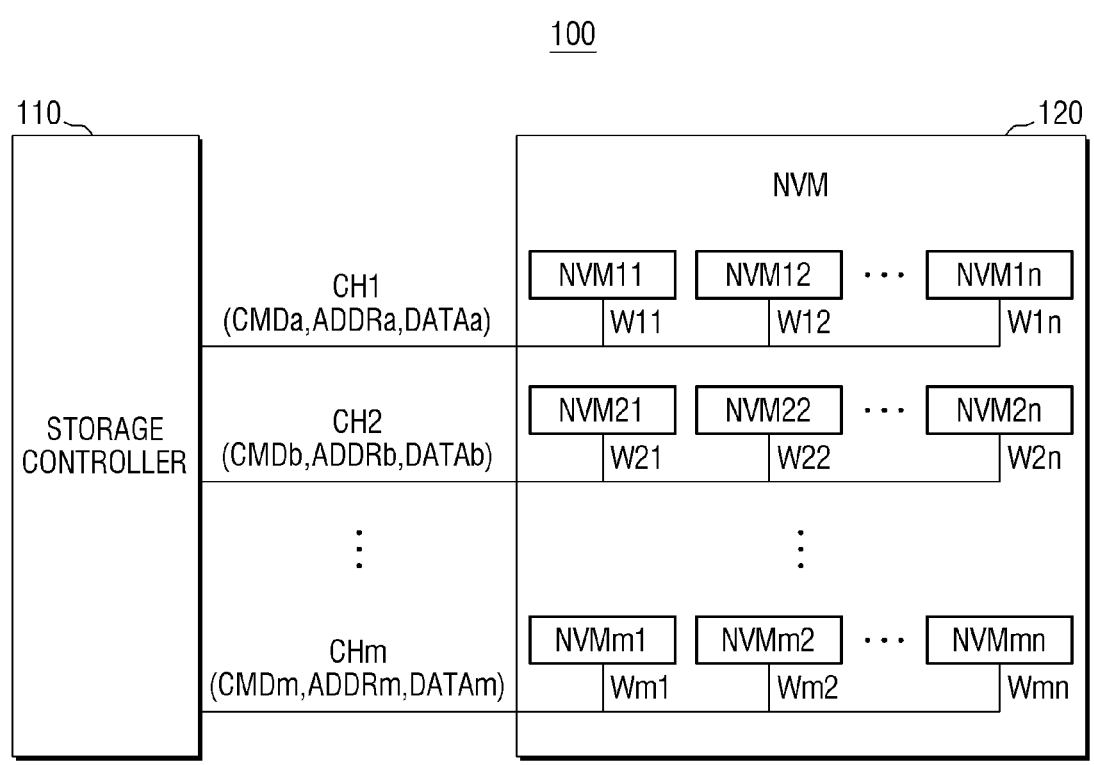
FIG. 1 is a block diagram showing a storage device according to an exemplary embodiment of the present disclosure.

FIG. 1 is a block diagram showing a storage device according to an exemplary embodiment of the present disclosure.

Referring to FIG. 1, a storage device 100 may include a non-volatile memory device 120 and a storage controller 110. The storage device 100 may support a plurality of channels CH1 to CHm, and the non-volatile memory device 120 and the storage controller 110 may be connected through the plurality of channels CH1 to CHm (m is a positive integer). For example, the storage device 100 may be implemented as a storage device such as a solid state drive (SSD).

The non-volatile memory device 120 may include a plurality of non-volatile memory devices NVM11 to NVM1n, NVM21 to NVM2n, . . . , and NVMm1 to NVMmn (n is a positive integer). Each of the non-volatile memory devices NVM11 to NVM1n, NVM21 to NVM2n, and NVMm1 to NVMmn may be connected to one of the plurality of channels CH1 to CHm through a corresponding way. For example, non-volatile memory devices NVM11 to NVM1n may be connected to a first channel CH1 through ways W11 to W1n, and non-volatile memory devices NVM21 to NVM2n may be connected to a second channel CH2 through ways W21 to W2n. In an exemplary embodiment, each of the non-volatile memory devices NVM11 to NVM1n, NVM21 to NVM2n, . . . , and NVMm1 to NVMmn may be implemented as an arbitrary memory unit capable of operating according to an individual command from the storage controller 110. For example, each of the non-volatile memory devices NVM11 to NVM1n, NVM21 to NVM2n, . . . , and NVMm1 to NVMmn may be implemented as a chip or a die, but the present disclosure is not limited thereto.

The storage controller 110 may transmit/receive signals to/from the non-volatile memory device 120 through the plurality of channels CH1 to CHm. For example, the storage controller 110 may transmit commands CMDa to CMDm, addresses ADDRa to ADDRm, and data DATAa to DATAm to the non-volatile memory device 120 through the channels CH1 to CHm, or the storage controller 110 may receive the data DATAa to DATAm from the non-volatile memory device 120.

The storage controller 110 may select one of the non-volatile memory devices NVM11 to NVM1n, NVM21 to NVM2n, . . . , and NVMm1 to NVMmn connected to the corresponding channel through each channel and transmit/receive signals to/from the selected non-volatile memory device. For example, the storage controller 110 may select a non-volatile memory device NVM11 of the non-volatile memory devices NVM11 to NVM1n connected to the first channel CH1. The storage controller 110 may transmit a command CMDa, an address ADDRa, and data DATAa to the selected non-volatile memory device NVM11 through the first channel CH1, or the storage controller 110 may receive the data DATAa from the selected non-volatile memory device NVM11.

The storage controller 110 may transmit/receive signals to/from the non-volatile memory device 120 in parallel through different channels. For example, the storage controller 110 may transmit a command CMDb to the non-volatile memory device 120 through the second channel CH2 while the command CMDa is transmitted to the non-volatile memory device 120 through the first channel CH1. For example, the storage controller 110 may receive data DATAb from the non-volatile memory device 120 through the second channel CH2 while the data DATAa is received from the non-volatile memory device 120 through the first channel CH1.

The storage controller 110 may control the overall operation of the non-volatile memory device 120. The storage controller 110 may transmit signals through the channels CH1 to CHm to control each of the non-volatile memory devices NVM11 to NVM1n, NVM21 to NVM2n, and NVMm1 to NVMmn connected to the channels CH1 to CHm. For example, the storage controller 110 may transmit the command CMDa and the address ADDRa through the first channel CH1 to control one selected from the non-volatile memory devices NVM11 to NVM1n.

Each of the non-volatile memory devices NVM11 to NVM1n, NVM21 to NVM2n, and NVMm1 to NVMmn may operate according to the control of the storage controller 110. For example, the non-volatile memory device NVM11 may program the data DATAa according to the command CMDa and the address ADDRa provided through the first channel CH1. For example, a non-volatile memory device NVM21 may read the data DATAb according to the command CMDb and the address ADDRb provided through the second channel CH2 and transmit the read data DATAb to the storage controller 110.

It is shown in FIG. 1 that the non-volatile memory device 120 communicates with the storage controller 110 through m channels and the non-volatile memory device 120 includes n non-volatile memory devices corresponding to each channel, but the number of channels and the number of non-volatile memory devices connected to one channel may be variously changed.

Figure 2:
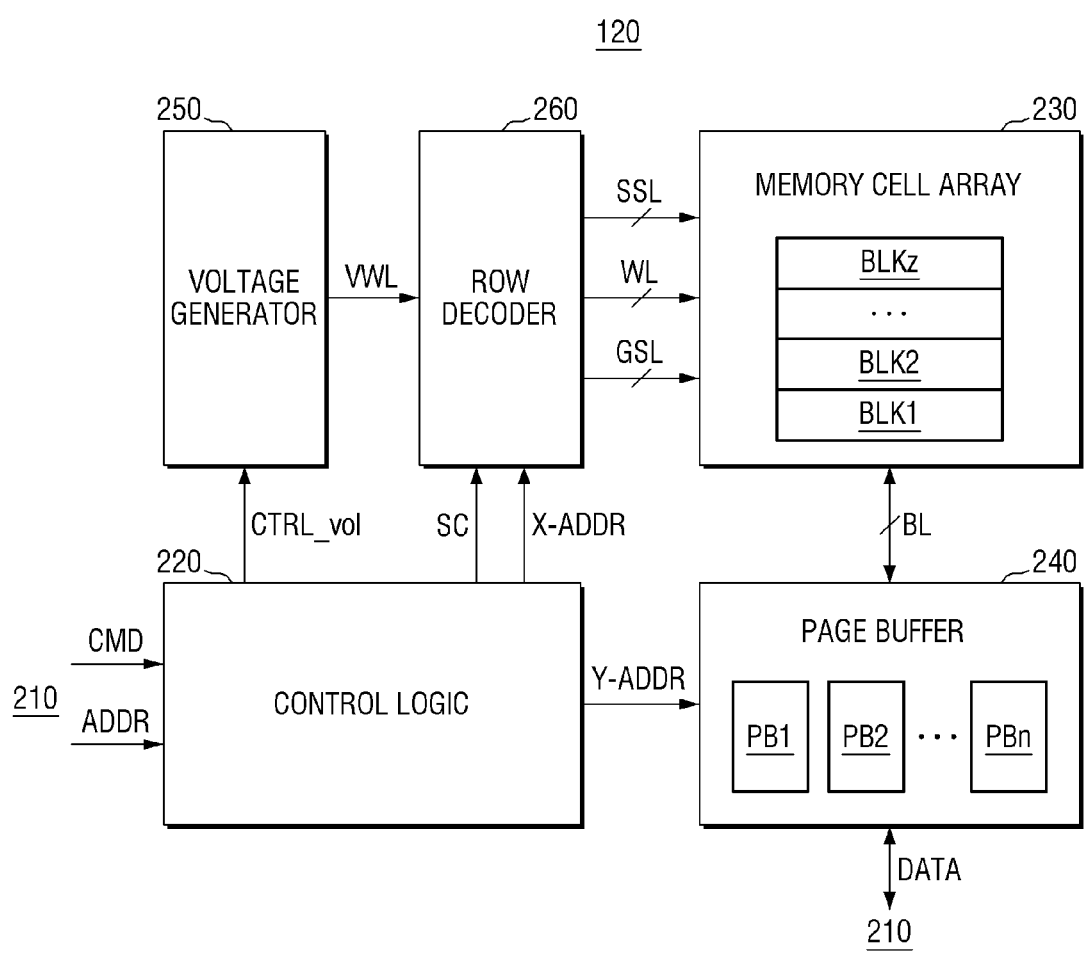
FIG. 2 is an exemplary block diagram showing a non-volatile memory device of FIG. 1 according to example embodiments.

FIG. 2 is an exemplary block diagram showing the non-volatile memory device of FIG. 1 according to example embodiments.

Referring to FIG. 2, the non-volatile memory device 120 may include a control logic circuit 220, a memory cell array 230, a page buffer circuit 240, a voltage generator 250, and a row decoder 260. The non-volatile memory device 120 may further include a memory interface circuit 210, a column logic, a pre-decoder, a temperature sensor, a command decoder, an address decoder, and the like. For example, the memory interface circuit 210 may be connected to the storage controller 110.

The control logic circuit 220 may generally control various operations in the non-volatile memory device 120. The control logic circuit 220 may output various control signals in response to a command CMD and/or an address ADDR from the memory interface circuit 210. For example, the control logic circuit 220 may output a voltage control signal CTRL vol, a row address X-ADDR, a column address Y-ADDR, and a switch control signal SC.

The memory cell array 230 may include a plurality of memory blocks BLK1 to BLKz (z is a positive integer), and each of the plurality of memory blocks BLK1 to BLKz may include a plurality of memory cells. The memory cell array 230 may be connected to the page buffer circuit 240 through bit lines BL, and may be connected to the row decoder 260 through word lines WL, string selection lines SSL, and ground selection lines GSL.

In an exemplary embodiment, the memory cell array 230 may include a three-dimensional (3D) memory cell array, and the 3D memory cell array may include a plurality of NAND strings. Each NAND string may include memory cells respectively connected to word lines vertically stacked on a substrate. In an exemplary embodiment, the memory cell array 230 may include a two-dimensional memory cell array, and the two-dimensional memory cell array may include a plurality of NAND strings disposed in row and column directions.

The page buffer circuit 240 may include a plurality of page buffers PB1 to PBn (n is an integer greater than or equal to 3), and the plurality of page buffers PB1 to PBn may each be connected to the memory cells through the plurality of bit lines BL. The page buffer circuit 240 may select at least one of the bit lines BL in response to the column address Y-ADDR. The page buffer circuit 240 may operate as a write driver or a sense amplifier according to an operation mode. For example, the page buffer circuit 240 may apply a bit line voltage corresponding to data to be programmed to the selected bit line during a program operation. The page buffer circuit 240 may sense data stored in the memory cell by sensing a current or voltage of the selected bit line during a read operation.

The voltage generator 250 may generate various types of voltages for performing program, read, and erase operations based on the voltage control signal CTRL vol. For example, the voltage generator 250 may generate a program voltage, a read voltage, a program verification voltage, an erase voltage, and the like as a word line voltage VWL.

The row decoder 260 may select one of the plurality of word lines WL and one of the plurality of string selection lines SSL in response to the row address X-ADDR. The row decoder 260 may connect the selected word line to the voltage generator 250 in response to the switch control signal SC. For example, the row decoder 260 may apply the program voltage and the program verification voltage to the selected word line during the program operation, and may apply the read voltage to the selected word line during the read operation.

Figure 3:
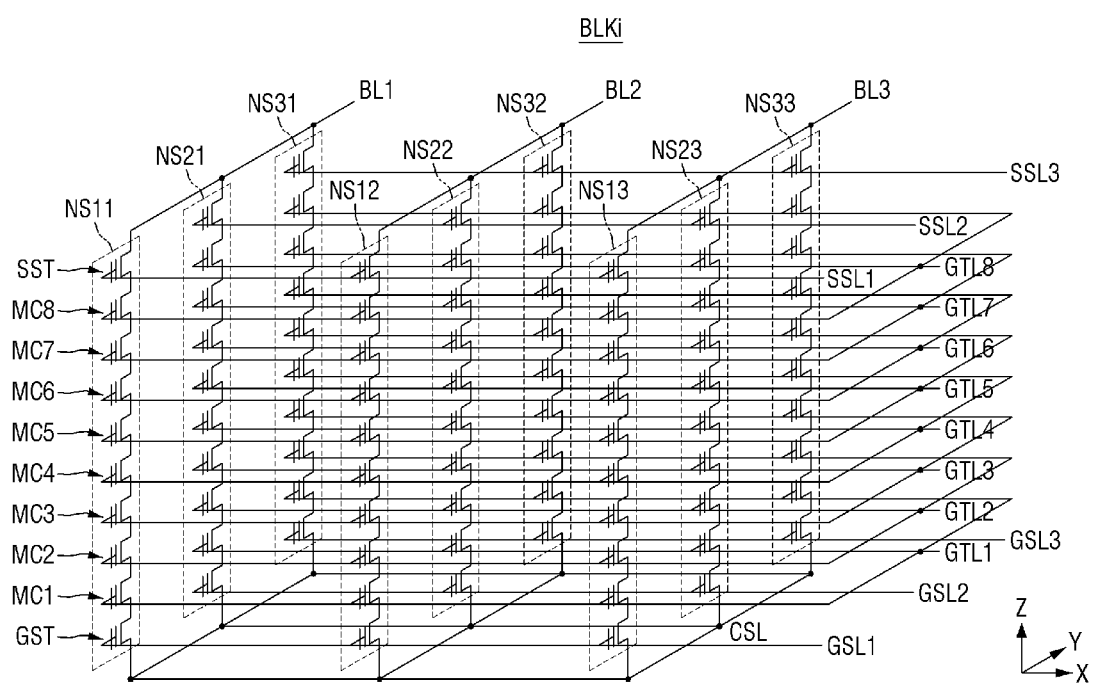
FIG. 3 is a view for describing a three-dimensional (3D) V-NAND structure that may be applied to the non-volatile memory device according to some exemplary embodiments.

FIG. 3 is a view for describing a three-dimensional (3D) V-NAND structure that may be applied to a non-volatile memory device according to some exemplary embodiments. When a storage module of the storage device is implemented as a 3D V-NAND type flash memory, each of a plurality of memory blocks constituting the storage module may be represented by an equivalent circuit as shown in FIG. 3.

A memory block BLKi shown in FIG. 3 represents a three-dimensional memory block formed on a substrate in a three-dimensional structure. For example, a plurality of memory NAND strings included in the memory block BLKi may be formed in a direction perpendicular to the substrate.

Referring to FIG. 3, the memory block BLKi may include a plurality of memory NAND strings NS11 NS12, NS13, NS21, NS22, NS23, NS31, NS32, and NS33 connected between bit lines BL1, BL2, and BL3 and a common source line CSL. Each of the plurality of memory NAND strings NS11 NS12, NS13, NS21, NS22, NS23, NS31, NS32, and NS33 may include a string selection transistor SST, a plurality of memory cells MC1, MC2, . . . , and MC8, and a ground selection transistor GST. It is shown in FIG. 3 that each of the plurality of memory NAND strings NS11 NS12, NS13, NS21, NS22, NS23, NS31, NS32, and NS33 includes eight memory cells MC1, MC2, . . . , and MC8, but the present disclosure is not necessarily limited thereto.

The string selection transistor SST may be connected to the corresponding string selection lines SSL1, SSL2, and SSL3. The plurality of memory cells MC1, MC2, . . . , and MC8 may be respectively connected to corresponding gate lines GTL1, GTL2, . . . , and GTL8. The gate lines GTL1, GTL2, . . . , and GTL8 may correspond to word lines WL1, WL2, . . . , and WL8, and some of the gate lines GTL1, GTL2, . . . , and GTL8 may correspond to dummy word lines. The ground selection transistor GST may be connected to the corresponding ground selection lines GSL1, GSL2, and GSL3. The string selection transistor SST may be connected to the corresponding bit lines BL1, BL2, and BL3, and the ground selection transistor GST may be connected to the common source line CSL.

Word lines (e.g., WL1) having the same height may be commonly connected, and the ground selection lines GSL1, GSL2, and GSL3 and the string selection lines SSL1, SSL2, and SSL3 may each be separated from each other. It is shown in FIG. 3 that the memory block BLKi is connected to eight gate lines GTL1, GTL2, . . . , and GTL8 and three bit lines BL1, BL2, and BL3, but the present disclosure is not necessarily limited thereto.

Figure 4:
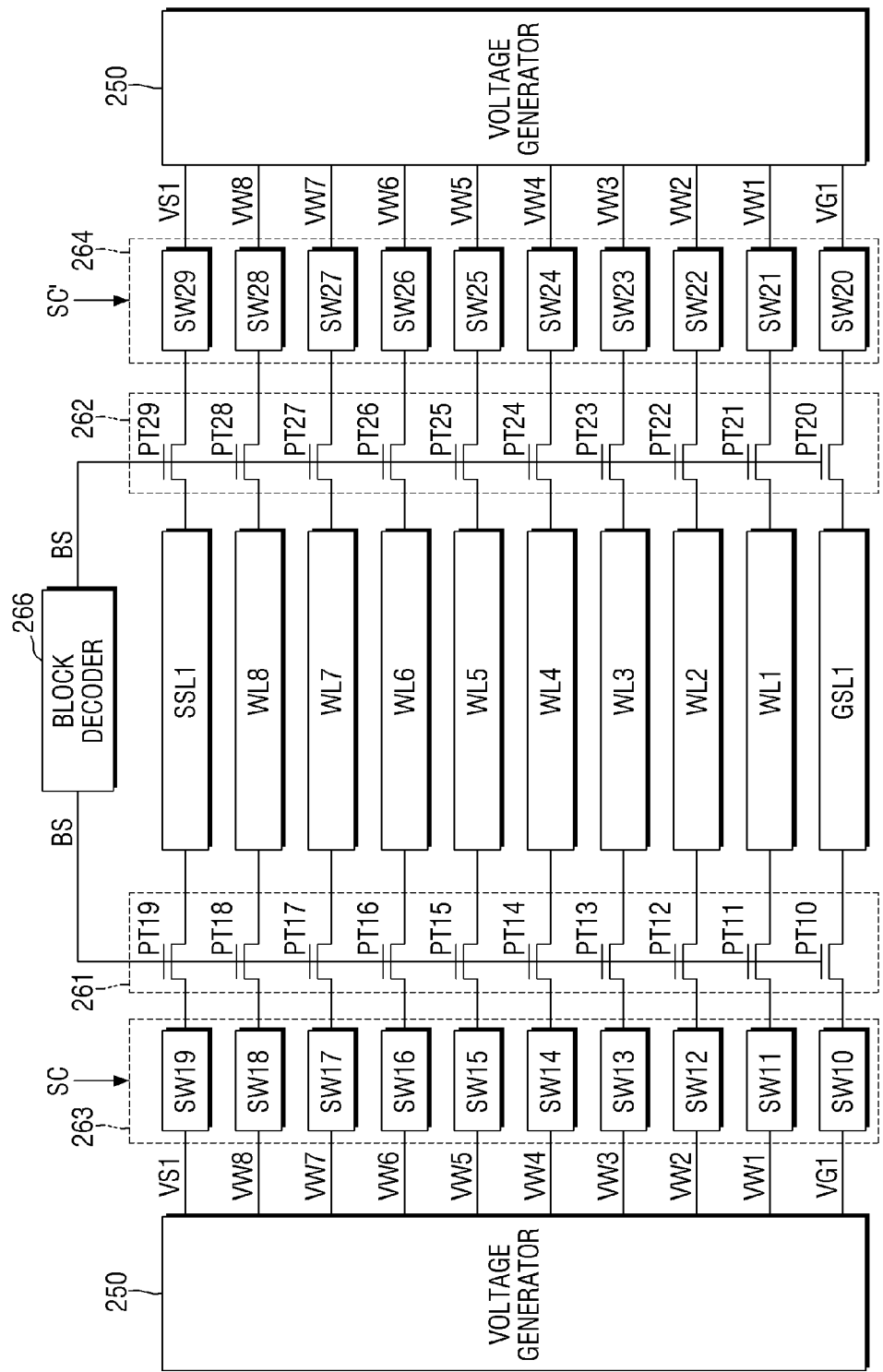
FIG. 4 is a view for describing the non-volatile memory device according to some exemplary embodiments.

FIG. 4 is a view for describing the non-volatile memory device according to some exemplary embodiments. FIG. 4 will be described using the NAND string NS11 of the memory blocks BLKi of FIG. 3 as an example. The word lines WL1 to WL8 of FIG. 4 correspond to the gate lines GTL1 to GTL8 of FIG. 3. Description of the NAND string NS11 may be applied to the NAND strings NS12, NS13, NS21, NS22, NS23, NS31, NS32, and NS33. Although the voltage generator 250 is shown separately in FIG. 4, this is only for convenience of description, and the voltage generator 250 may be integrally configured.

Referring to FIGS. 2 and 4, in the non-volatile memory device according to some exemplary embodiments, the row decoder 260 may include a first pass circuit 261, a second pass circuit 262, a first switch circuit 263, a second switch circuit 264, and a block decoder 266.

The first pass circuit 261 may include a plurality of first pass transistors PT10 to PT19. Each of the plurality of first pass transistors PT10 to PT19 may be connected to one side of each of the ground selection line GSL1, the plurality of word lines WL1 to WL8, and the string selection line SSL1.

The second pass circuit 262 may include a plurality of second pass transistors PT20 to PT29. Each of the plurality of second pass transistors PT20 to PT29 may be connected to the other side of each of the ground selection line GSL1, the plurality of word lines WL1 to WL8, and the string selection line SSL1.

The first pass transistor PT10 may be connected to one side of the ground selection line GSL1, and the second pass transistor PT20 may be connected to the other side of the ground selection line GSL1. Each of the first pass transistors PT11 to PT18 may be connected to one side of each of the word lines WL1 to WL8, and each of the second pass transistors PT21 to PT28 may be connected to the other side of each of the word lines WL1 to WL8. The first pass transistor PT19 may be connected to one side of the string selection line SSL1, and the second pass transistor PT29 may be connected to the other side of the string selection line SSL1.

Gates of the plurality of first pass transistors PT10 to PT19 and gates of the plurality of second pass transistors PT20 to PT29 may be connected to a block selection signal BS. Each of the plurality of first pass transistors PT10 to PT19 may connect one side of each of the ground selection line GSL1, the plurality of word lines WL1 to WL8, and the string selection line SSL1 to the first switch circuit 263 in response to the block selection signal BS. Each of the plurality of second pass transistors PT20 to PT29 may connect the other side of each of the ground selection line GSL1, the plurality of word lines WL1 to WL8, and the string selection line SSL1 to the second switch circuit 264 in response to the block selection signal BS.

The first switch circuit 263 may be enabled in response to the switch control signal SC and connect the first pass circuit 261 to the voltage generator 250. The first switch circuit 263 may include a plurality of first switches SW10 to SW19. Each of the plurality of first switches SW10 to SW19 may connect each of the plurality of first pass transistors PT10 to PT19 to the voltage generator 250 in response to the switch control signal SC.

The second switch circuit 264 may be enabled in response to a switch control signal SC' and connect the second pass circuit 262 to the voltage generator 250. The second switch circuit 264 may include a plurality of second switches SW20 to SW29. Each of the plurality of second switches SW20 to SW29 may connect each of the plurality of second pass transistors PT20 to PT29 to the voltage generator 250 in response to the switch control signal SC'. For example, the control logic circuit 220 may generate the switch control signal SC' the same as the switch control signal SC.

The voltage generator 250 may generate various operating voltages. For example, the voltage generator 250 may generate a ground selection voltage VG1, first to eighth word line voltages VW1 to VW8, and a string selection voltage VS1.

The ground selection line GSL1 may receive the ground selection voltage VG1 at one side thereof through the first switch SW10 and the first pass transistor PT10 and may receive the ground selection voltage VG1 at the other side thereof through the second switch SW20 and the second pass transistor PT20. Each of the first to eighth word lines WL1 to WL8 may receive each of the first to eighth word line voltages VW1 to VW8 at one side thereof through each of the first switches SW11 to SW18 and each of the first pass transistors PT11 to PT18 and may receive each of the first to eighth word line voltages VW1 to VW8 at the other side thereof through each of the second switches SW21 to SW28 and each of the first to second pass transistors PT21 to PT28. The string selection line SSL1 may receive the string selection voltage VS1 at one side thereof through the first switch SW19 and the first pass transistor PT19 and may receive the string selection voltage VS1 at the other side thereof through the second switch SW29 and the second pass transistor PT29.

The block decoder 266 may generate the block selection signal BS for selecting the selected memory block. The block selection signal BS may be provided to the first pass circuit 261 and the second pass circuit 262.

In the non-volatile memory device according to some exemplary embodiments, each of the ground selection line GSL1, the plurality of word lines WL1 to WL8, and the string selection line SSL1 may be driven at both sides thereof (i.e., one side and the other side thereof) by the first pass circuit 261, the second pass circuit 262, the first switch circuit 263, and the second switch circuit 264. Accordingly, an operating voltage provided to each of the ground selection line GSL1, the plurality of word lines WL1 to WL8, and the string selection line SSL1 may be transferred more quickly.

If the first pass circuit 261 and the second pass circuit 262 are connected to the voltage generator 250 through only one switch circuit, the operating voltage is simultaneously applied to both sides of each of the ground selection line GSL1, the plurality of word lines WL1 to WL8, and the string selection line SSL1, and thus it may be difficult to detect a defect on either side. For example, the defect may refer to a defect occurring in a path from one side or the other side of each of the ground selection line GSL1, the plurality of word lines WL1 to WL8, and the string selection line SSL1 to the one switch circuit.

However, in the non-volatile memory device according to some exemplary embodiments, the operating voltage may be provided to the first pass circuit 261 and the second pass circuit 262 by the first switch circuit 263 and the second switch circuit 264, respectively. Therefore, it is possible to detect the defect. Hereinafter, this will be described in detail with reference to FIGS. 5 to 14.

FIGS. 5 to 8 are views for describing an operation of the non-volatile memory device according to some exemplary embodiments. FIGS. 5 to 8 will be described using the word line WL1 of FIG. 4 as an example. The operation of the non-volatile memory device may include first through fourth modes in a test operation. Description of the word line WL1 may be applied to the ground selection line GSL1, the word lines WL2 to WL8, and the string selection line SSL1.

Figure 5:
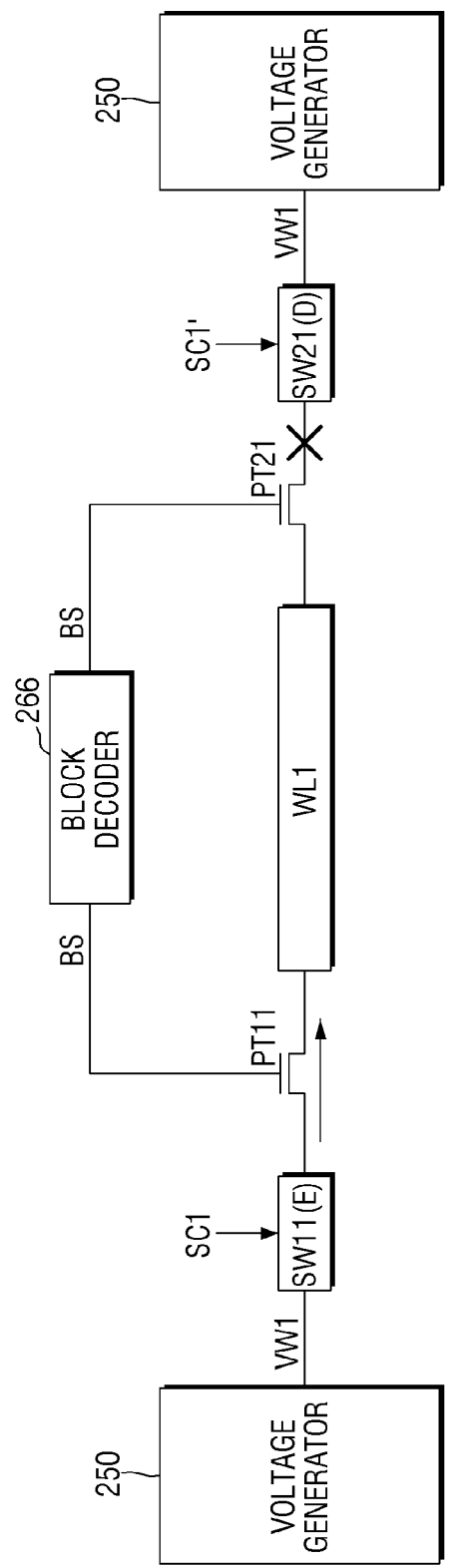
FIGS. 5 to 8 are views for describing an operation of the non-volatile memory device according to some exemplary embodiments.

Referring to FIG. 5, a first switch SW11 and a second switch SW21 may operate in the first mode in response to a first switch control signal SC1 and a second switch control signal SC1', respectively. In the first mode, the control logic circuit 220 may generate the first switch control signal SC1 and the second switch control signal SC1' different from the first switch control signal SC1. The first switch SW11 may be enabled by the first switch control signal SC1, and the second switch SW21 may be disabled by the second switch control signal SC1'. For example, the first switch SW11 may be enabled by the first switch control signal SC1 having a logic high level, and the second switch SW21 may be disabled by the second switch control signal SC1' having a logic low level. Accordingly, one side of the word line WL1 is connected to the voltage generator 250 to receive a word line voltage VW1 at the one side of the word line WL1, and the other side of the word line WL1 is not connected to the voltage generator 250 such that the word line voltage VW1 is not received at the other side of the word line WL1.

Figure 6:
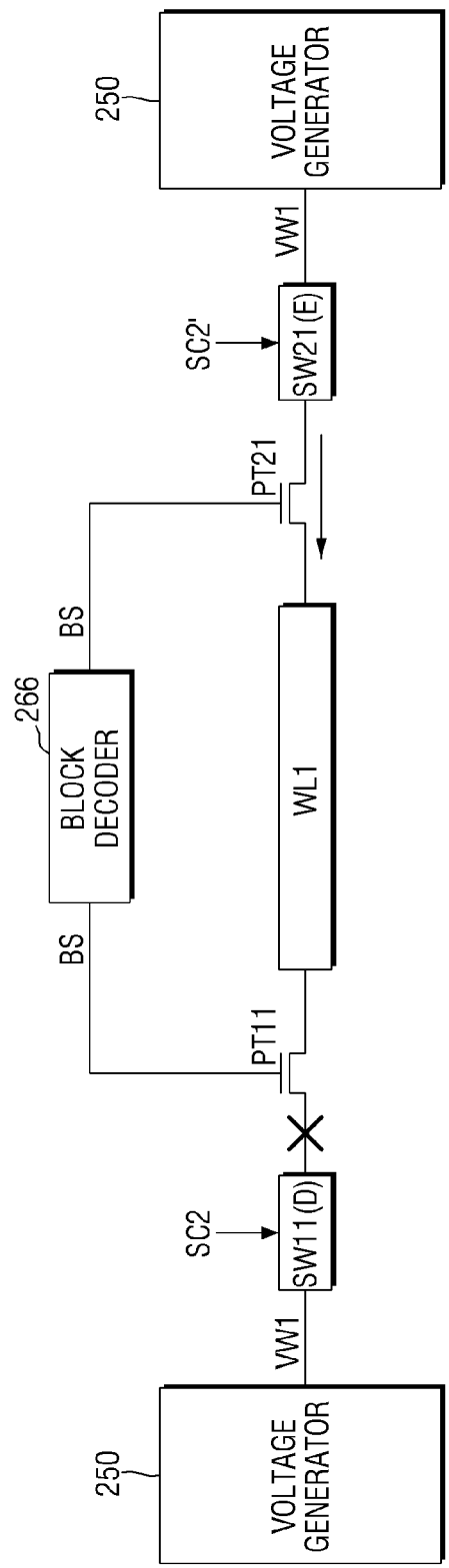

Referring to FIG. 6, the first switch SW11 and the second switch SW21 may operate in the second mode in response to a first switch control signal SC2 and a second switch control signal SC2', respectively. In the second mode, the control logic circuit 220 may generate the first switch control signal SC2 and the second switch control signal SC2' different from the first switch control signal SC2. The first switch SW11 may be disabled by the first switch control signal SC2, and the second switch SW21 may be enabled by the second switch control signal SC2'. For example, the first switch SW11 may be disabled by the first switch control signal SC2 having a logic low level, and the second switch SW21 may be enabled by the second switch control signal SC2' having a logic high level. Accordingly, one side of the word line WL1 is not connected to the voltage generator 250 such that the word line voltage VW1 is not received at the one side of the word line WL1, and the other side of the word line WL1 is connected to the voltage generator 250 to receive the word line voltage VW1 at the other side of the word line WL1.

Figure 7:
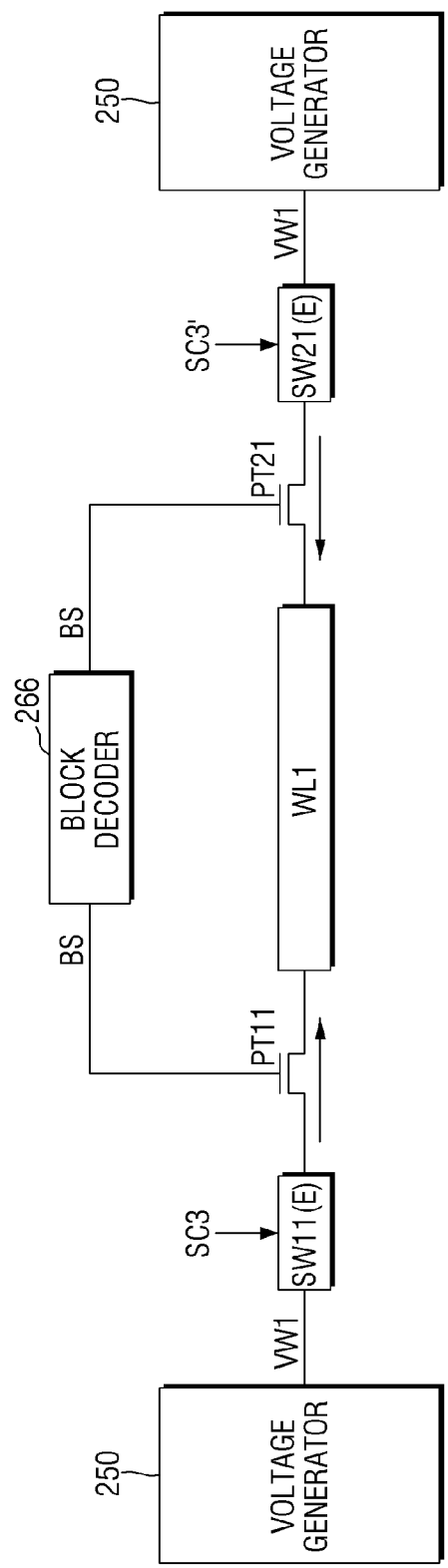

Referring to FIG. 7, the first switch SW11 and the second switch SW21 may operate in the third mode in response to a first switch control signal SC3 and a second switch control signal SC3', respectively. In the third mode, the control logic circuit 220 may generate the first switch control signal SC3 and the second switch control signal SC3' the same as the first switch control signal SC3. The first switch SW11 may be enabled by the first switch control signal SC3, and the second switch SW21 may be enabled by the second switch control signal SC3'. For example, the first switch SW11 may be enabled by the first switch control signal SC3 having a logic high level, and the second switch SW21 may be enabled by the second switch control signal SC3' having a logic high level. Accordingly, one side and the other side of the word line WL1 are connected to the voltage generator 250 to receive the word line voltage VW1 at the one side and the other side of the word line WL1.

Figure 8:
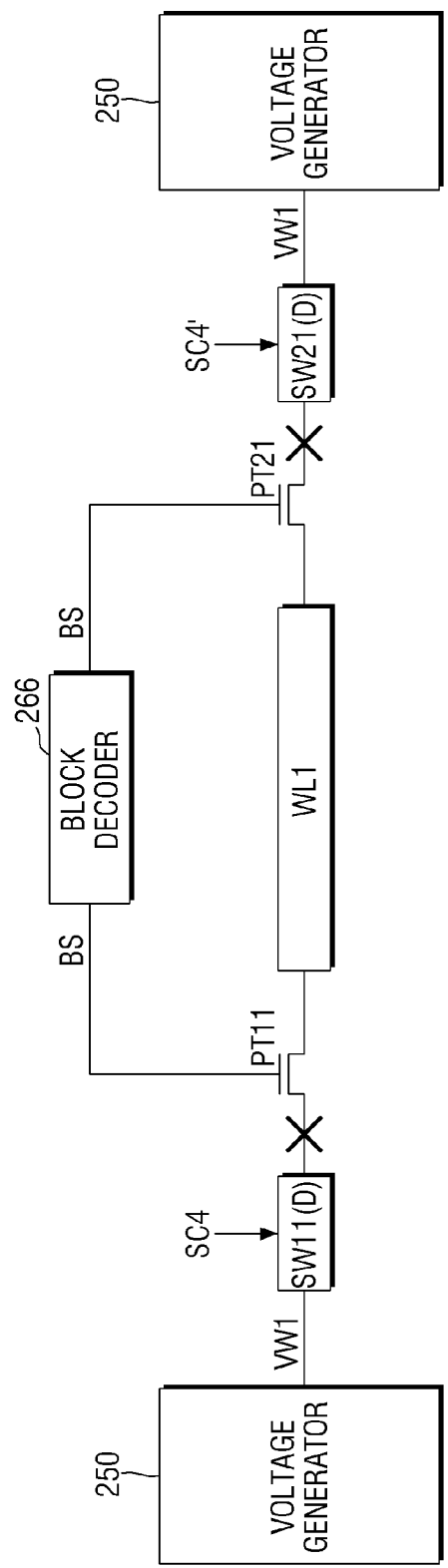

Referring to FIG. 8, the first switch SW11 and the second switch SW21 may operate in the fourth mode in response to a first switch control signal SC4 and a second switch control signal SC4', respectively. In the fourth mode, the control logic circuit 220 may generate the first switch control signal SC4 and the second switch control signal SC4' the same as the first switch control signal SC4. The first switch SW11 may be disabled by the first switch control signal SC4, and the second switch SW21 may be disabled by the second switch control signal SC4'. For example, the first switch SW11 may be disabled by the first switch control signal SC4 having a logic low level, and the second switch SW21 may be disabled by the second switch control signal SC4' having a logic low level. Accordingly, one side and the other side of the word line WL1 are not connected to the voltage generator 250 such that the word line voltage VW1 is not received at the one side and the other side of the word line WL1.

Figure 9:
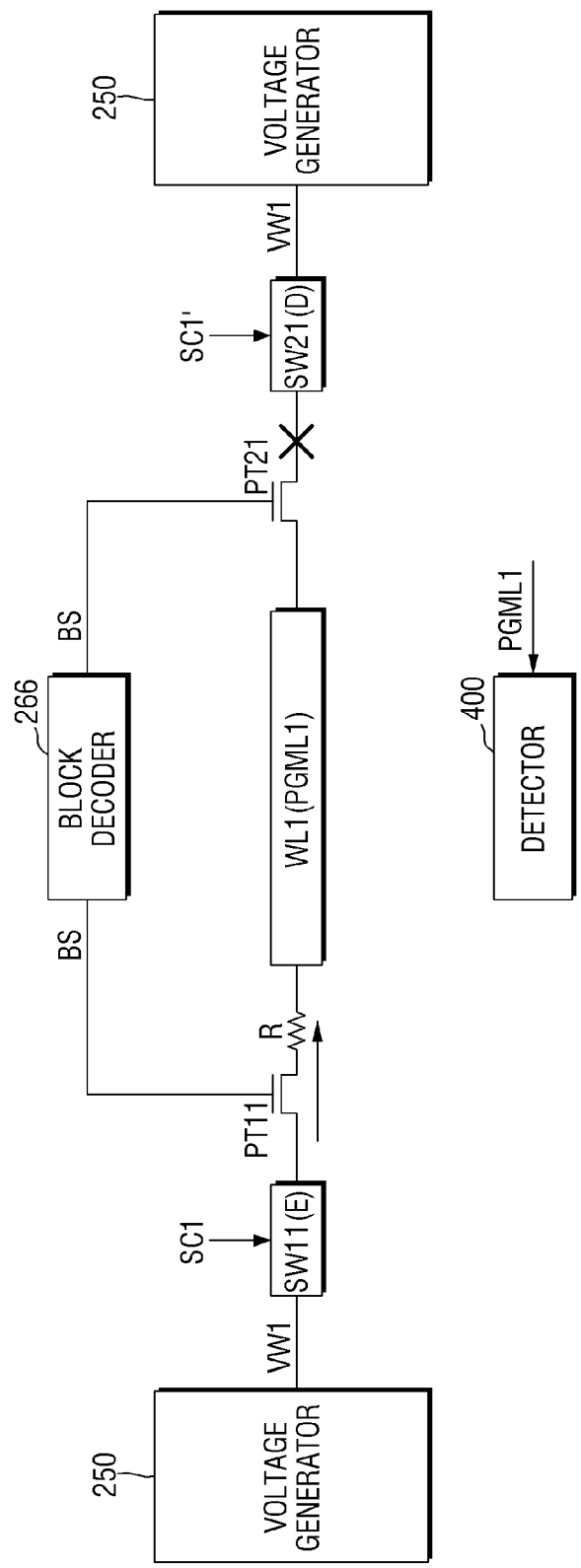
FIGS. 9 and 10 are views for describing a method of detecting a defect in the non-volatile memory device according to some exemplary embodiments.
Figure 10:
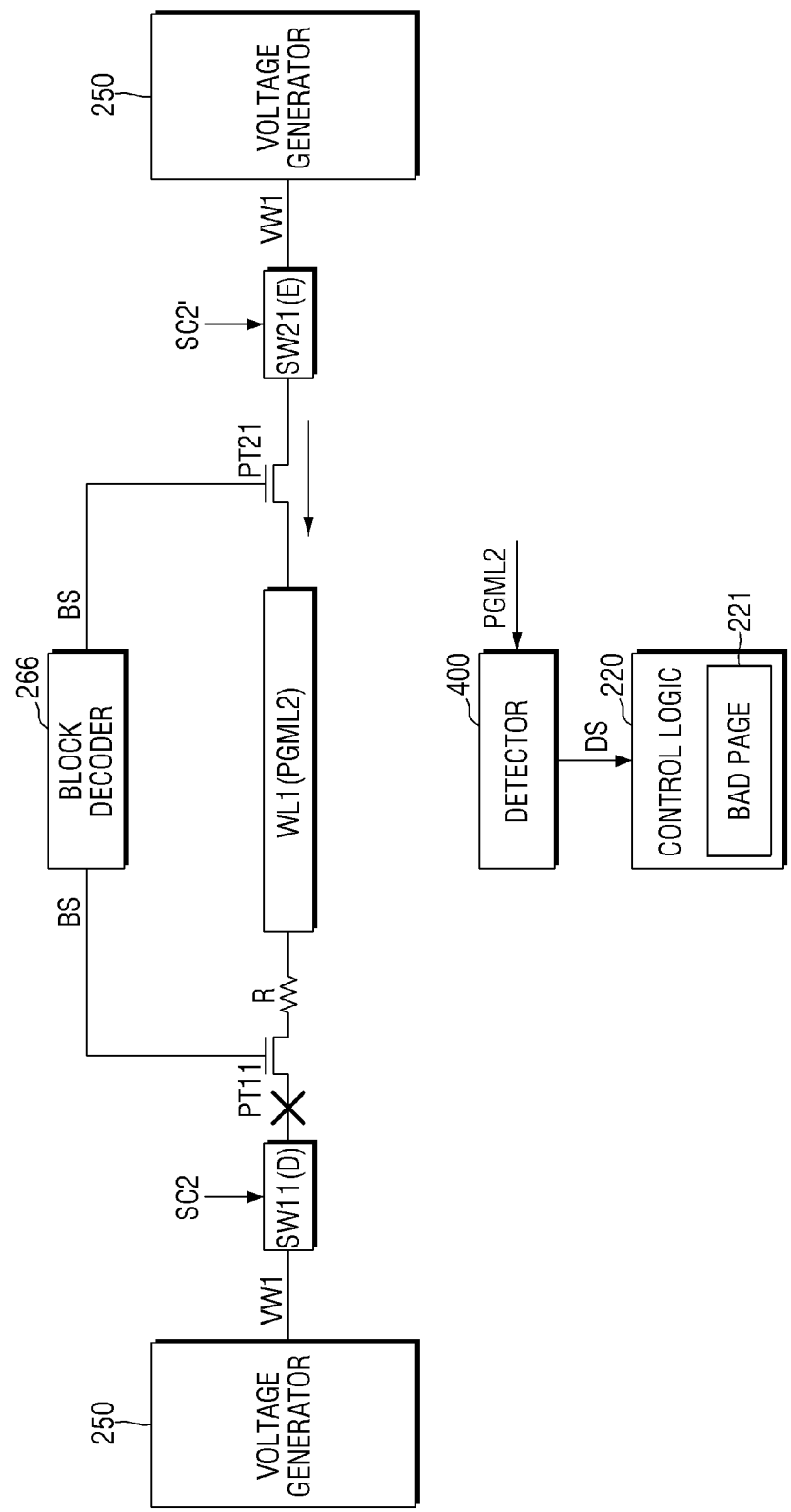

FIGS. 9 and 10 are views for describing a method of detecting a defect in the non-volatile memory device according to some exemplary embodiments. In FIGS. 9 and 10, a case in which a defect (e.g., resistor R) is present between one side of the word line WL1 and the first switch SW11 will be described as an example. For example, it is assumed that the defect has occurred between the one side of the word line WL1 and the first switch SW11.

Referring to FIGS. 9 and 10, the non-volatile memory device according to some exemplary embodiments may further include a detector 400. For example, the detector 400 may be implemented by hardware. For example, the detector 400 may be implemented by software and implemented by the control logic circuit 220.

The detector 400 may detect a defect between the word line WL1 and the switches SW11 and SW21 based on the number of program loops. Specifically, the detector 400 may detect the defect based on the number of program loops when a program operation is performed by applying a program voltage to one side of the word line WL1 and the number of program loops when the program operation is performed by applying the program voltage to the other side of the word line WL1.

For example, referring to FIG. 9, the first switch SW11 and the second switch SW21 may operate in the first mode in response to the first switch control signal SC1 and the second switch control signal SC1', respectively. In the first mode, the word line WL1 may receive a program voltage VW1 from one side thereof to be programmed through the number of first program loops PGML1. For example, the word line WL1 may be programmed by an incremental step pulse programming (ISPP) method. Specifically, the voltage generator 250 may generate a program voltage whose level is increased as much as a step voltage from a previous program voltage whenever the program loop is performed and may generate a verification voltage whose level is changed as the number of program loops increases.

Next, referring to FIG. 10, the first switch SW11 and second switch SW21 may operate in the second mode in response to the first switch control signal SC2 and the second switch control signal SC2', respectively. In the second mode, the word line WL1 may receive the program voltage VW1 from the other side thereof to be programmed through the number of second program loops PGML2. Since there is the defect R on one side of the word line WL1, the number of first program loops PGML1 may be greater than the number of second program loops PGML2.

The detector 400 may compare the number of first program loops PGML1 with the number of second program loops PGML2.

For example, when a difference between the number of first program loops PGML1 and the number of second program loops PGML2 is equal to or greater than a number of set value (or a predetermined number), the detector 400 may output a detection signal DS indicating that the defect R has occurred between at least one of one side and the other side of the word line WL1 and the first and second switches SW11 and SW21. The control logic circuit 220 may store address information corresponding to the word line WL1 as a bad page according to the detection signal DS.

For example, the detector 400 may store a defect level according to the difference between the number of first program loops PGML1 and the number of second program loops PGML2. The detector 400 may output the defect level according to the difference between the number of first program loops PGML1 and the number of second program loops PGML2 as the detection signal DS. The control logic circuit 220 may receive the detection signal DS and store the address information corresponding to the word line WL1 as the bad page according to the defect level.

For example, the detector 400 may output the difference between the number of first program loops PGML1 and the number of second program loops PGML2 as the detection signal DS. The control logic circuit 220 may store the defect level according to the difference between the number of first program loops PGML1 and the number of second program loops PGML2. The control logic circuit 220 may store the address information corresponding to the word line WL1 as the bad page according to the defect level.

Alternatively, the detection signal DS may be output to the outside of the non-volatile memory device 120. The word line WL1 or the memory block BLKi of the corresponding non-volatile memory device 120 may be discarded according to the detection signal DS.

Figure 11:
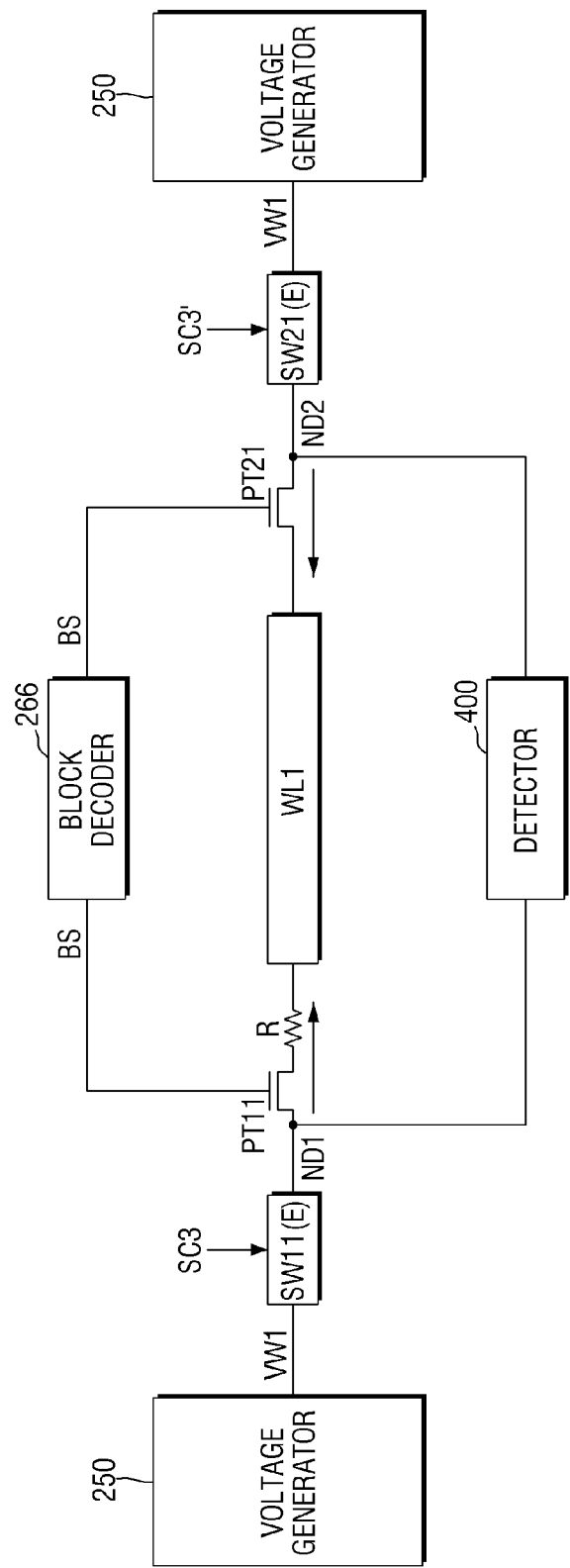
FIGS. 11 and 12 are views for describing a method of detecting a defect in the non-volatile memory device according to some exemplary embodiments.
Figure 12:
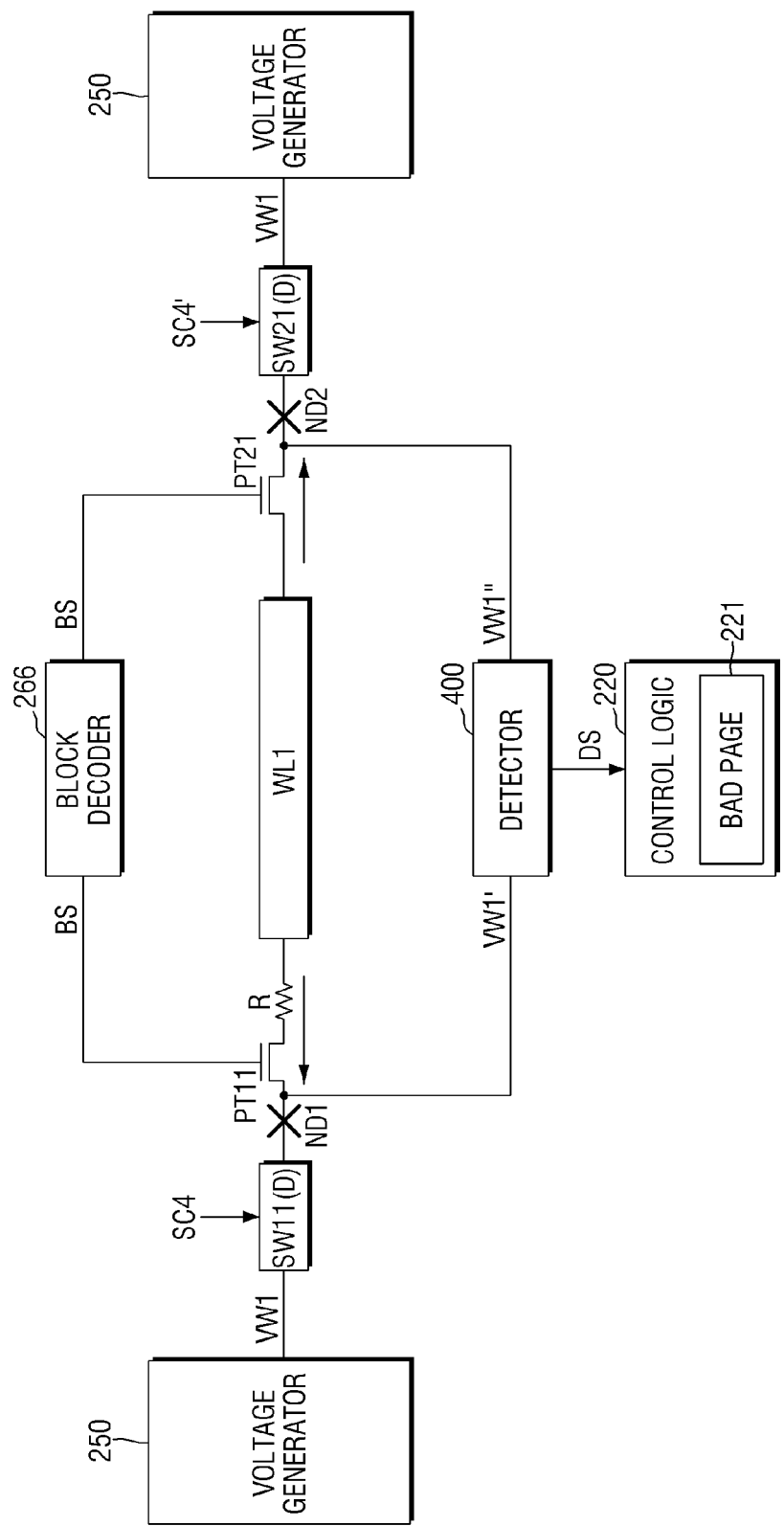

FIGS. 11 and 12 are views for describing a method of detecting a defect in the non-volatile memory device according to some exemplary embodiments. In FIGS. 11 and 12, a case in which a defect (e.g., resistor R) is present between one side of the word line WL1 and the first switch SW11 will be described as an example.

Referring to FIGS. 11 and 12, the non-volatile memory device according to some exemplary embodiments may further include a detector 400. The detector 400 may be connected to a first node ND1 between the first switch SW11 and one side of the word line WL1 and a second node ND2 between the second switch SW21 and the other side of the word line WL1. For example, the detector 400 may be connected to the first node ND1 between the first switch SW11 and the first pass transistor PT11 and the second node ND2 between the second switch SW21 and the second pass transistor PT21. The detector 400 may compare a voltage of the first node ND1 with a voltage of the second node ND2 to detect a defect between the word line WL1 and the switches SW11 and SW21.

For example, referring to FIG. 11, the first switch SW11 and the second switch SW21 may operate in the third mode in response to the first switch control signal SC3 and the second switch control signal SC3', respectively. In the third mode, the word line WL1 may receive the word line voltage VW1 from one side and the other side thereof by turning on the first and second switches SW11 and SW21. In this case, the first and second switches SW11 and SW21 are turned on for a short period of time.

Although not shown, in example embodiments, the detector 400 may include a third switch connected between the first node ND1 and the detector 400 and a fourth switch connected between the second node ND2 and the detector 400. For example, when the word line WL1 receives the word line voltage VW1 from one side and the other side thereof, the third and fourth switches may be turned off.

Next, referring to FIG. 12, the first switch SW11 and the second switch SW21 may operate in the fourth mode in response to the first switch control signal SC4 and the second switch control signal SC4', respectively. In the fourth mode, the word line WL1 does not receive the word line voltage VW1 from one side and the other side thereof by turning off the first and second switches SW11 and SW21 after the first and second switches SW11 and SW21 are turned on for the short period of time. The word line voltage VW1 provided to the word line WL1 may be discharged through one side and the other side thereof. Since there is the defect R on one side of the word line WL1, a voltage at the one side of the word line WL1 may be lower than the word line voltage VW1 and a first voltage VW1' of the first node ND1 may be less than a second voltage VW1" of the second node ND2.

The detector 400 may compare the first voltage VW1' of the first node ND1 with the second voltage VW1" of the second node ND2. Although not shown, in this case, the third switch connected between the first node ND1 and the detector 400 and the fourth switch connected between the second node ND2 and the detector 400 may be turned on.

For example, after a predetermined time has elapsed in the fourth mode, when a difference between the first voltage VW1' of the first node ND1 and the second voltage VW1" of the second node ND2 is equal to or greater than a set value (or a predetermined voltage), the detector 400 may output the detection signal DS indicating that the defect R has occurred between at least one of one side and the other side of the word line WL1 and the first and second switches SW11 and SW21. The control logic circuit 220 may store address information corresponding to the word line WL1 as a bad page according to the detection signal DS.

For example, after the predetermined time has elapsed in the fourth mode, the detector 400 may store a defect level according to the difference between the first voltage VW1' of the first node ND1 and the second voltage VW1" of the second node ND2. The detector 400 may output the defect level according to the difference between the first voltage VW1' and the second voltage VW1" as the detection signal DS. The control logic circuit 220 may receive the detection signal DS and store the address information corresponding to the word line WL1 as the bad page according to the defect level.

For example, the detector 400 may output the difference between the first voltage VW1' and the second voltage VW1" as the detection signal DS. The control logic circuit 220 may store the defect level according to the difference between the first voltage VW1' and the second voltage VW1". The control logic circuit 220 may store the address information corresponding to the word line WL1 as the bad page according to the defect level.

Alternatively, the detection signal DS may be output to the outside of the non-volatile memory device 120. The word line WL1 or the memory block BLKi of the corresponding non-volatile memory device 120 may be discarded according to the detection signal DS.

Figure 13:
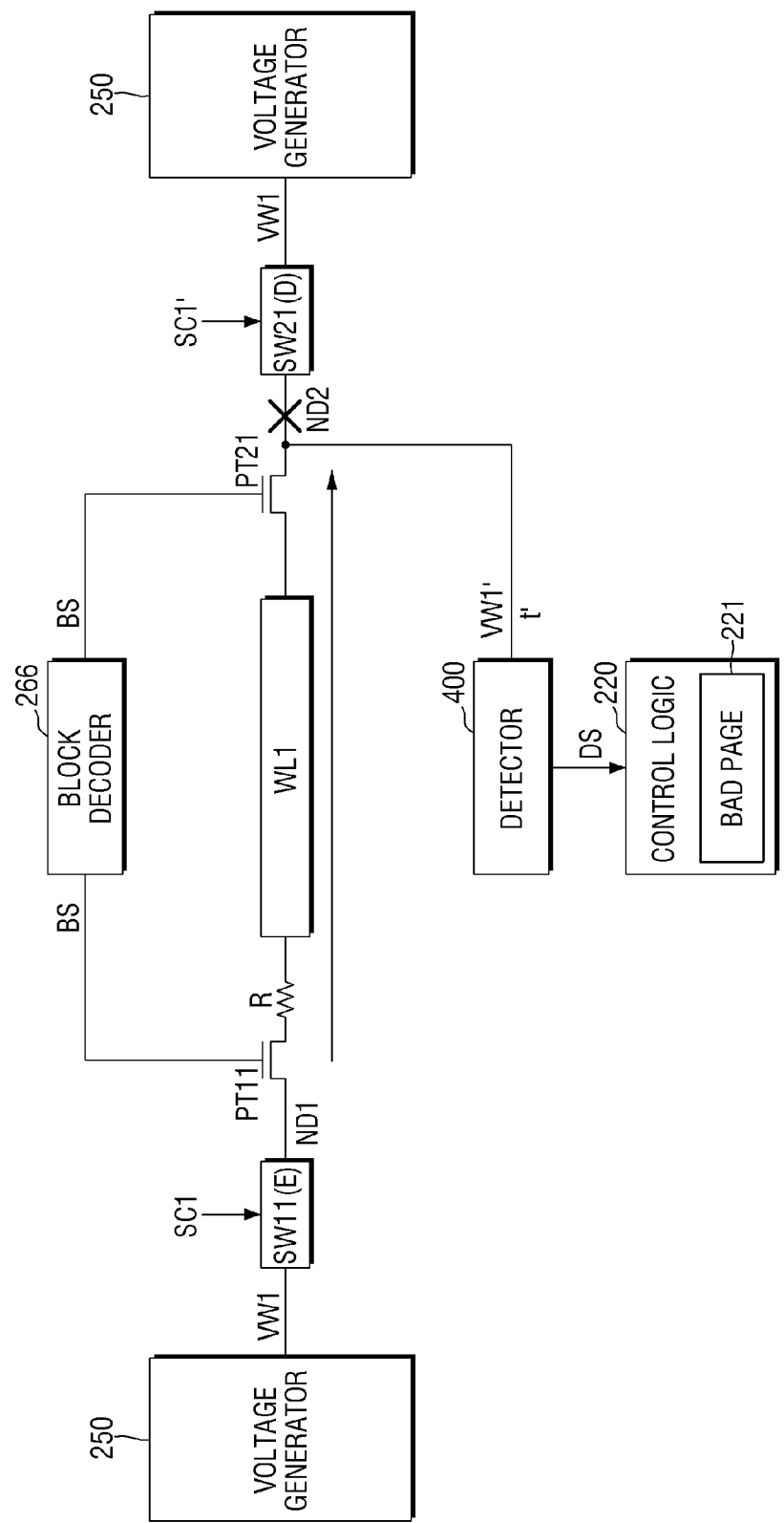
FIGS. 13 and 14 are views for describing a method of detecting a defect in the non-volatile memory device according to some exemplary embodiments.
Figure 14:
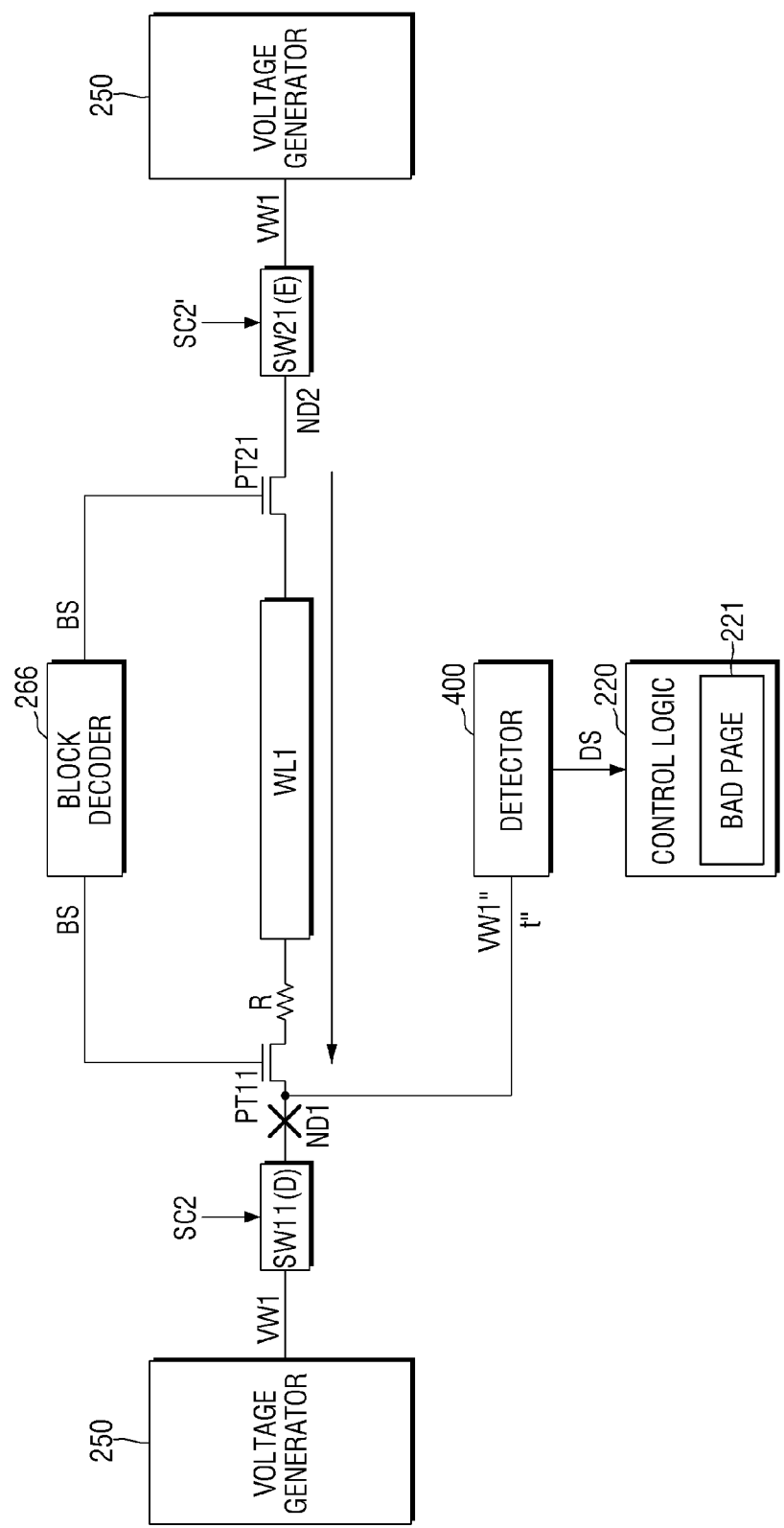

FIGS. 13 and 14 are views for describing a method of detecting a defect in the non-volatile memory device according to some exemplary embodiments. In FIGS. 13 and 14, a case in which a defect (e.g., resistor R) is present between one side of the word line WL1 and the first switch SW11 will be described as an example.

Referring to FIG. 13, the non-volatile memory device according to some exemplary embodiments may further include a detector 400. The detector 400 may be connected to any one of the first node ND1 between the first switch SW11 and one side of the word line WL1 and the second node ND2 between the second switch SW21 and the other side of the word line WL1. The detector 400 may detect a defect between the word line WL1 and the switches SW11 and SW21 based on a voltage of the node to which the detector 400 is connected.

For example, referring to FIG. 13, the detector 400 may be connected to the second node ND2 between the other side of the word line WL1 and the second switch SW21. In this case, the first switch SW11 and the second switch SW21 may operate in the first mode in response to the first switch control signal SC1 and the second switch control signal SC1', respectively. In the first mode, the word line WL1 may receive the word line voltage VW1 from one side thereof. A current may flow to the second node ND2 by the word line voltage VW1. That is, the word line voltage VW1 may be applied to the word line WL1 from a side to which the detector 400 is not connected. Although not shown, in this case, the third switch connected between the first node ND1 and the detector 400 may be turned off and the fourth switch connected between the second node ND2 and the detector 400 may be turned on.

For example, the detector 400 may detect the voltage VW1' of the second node ND2 after a predetermined time has elapsed in the first mode. For example, the detector 400 may detect a time t' required for the voltage of the second node ND2 to reach a target voltage in the first mode.

For example, when the voltage VW1' is equal to or less than a set value (or a predetermined voltage) and the time t' is equal to or greater than a set time (or a predetermined time), the detector 400 may output the detection signal DS indicating that the defect R has occurred between at least one of one side and the other side of the word line WL1 and the first and second switches SW11 and SW21. Subsequently, the control logic circuit 220 may store address information corresponding to the word line WL1 as a bad page according to the detection signal DS.

For example, the detector 400 may store a defect level according to the magnitude of the voltage VW1' or a defect level according to the time t'. The detector 400 may output the defect level according to the magnitude of the voltage VW1' or the defect level according to the time t' as the detection signal DS. Subsequently, the control logic circuit 220 may receive the detection signal DS and store the address information corresponding to the word line WL1 as the bad page according to the defect level.

For example, the detector 400 may output the voltage VW1' or the time t' as the detection signal DS. The control logic circuit 220 may store the defect level according to the magnitude of the voltage VW1' or the defect level according to the time t'. The control logic circuit 220 may store the address information corresponding to the word line WL1 as the bad page according to the defect level.

Alternatively, the detection signal DS may be output to the outside of the non-volatile memory device 120. The word line WL1 or the memory block BLKi of the corresponding non-volatile memory device 120 may be discarded according to the detection signal DS.

Referring to FIG. 14, the detector 400 may be connected to the first node ND1 between one side of the word line WL1 and the first switch SW11. In this case, the first switch SW11 and the second switch SW21 may operate in the second mode in response to the first switch control signal SC2 and the second switch control signal SC2', respectively. In the second mode, the word line WL1 may receive the word line voltage VW1 from the other side thereof. A current may flow to the first node ND1 by the word line voltage VW1. Although not shown, in this case, the third switch connected between the first node ND1 and the detector 400 may be turned on and the fourth switch connected between the second node ND2 and the detector 400 may be turned off.

For example, the detector 400 may detect the voltage VW1" of the first node ND1 after a predetermined time has elapsed in the second mode. For example, the detector 400 may detect a time t" required for the voltage of the first node ND1 to reach a target voltage in the second mode.

For example, when the voltage VW1" is less than or equal to the voltage of set value and the time t" is equal to or greater than the set time, the detector 400 may output the detection signal DS indicating that the defect R has occurred between at least one of one side and the other side of the word line WL1 and the first and second switches SW11 and SW21. The control logic circuit 220 may store address information corresponding to the word line WL1 as the bad page according to the detection signal DS.

For example, the detector 400 may store the defect level according to the magnitude of the voltage VW1" or the defect level according to the time t". The detector 400 may output the defect level according to the magnitude of the voltage VW1" or the defect level according to the time t" as the detection signal DS. The control logic circuit 220 may receive the detection signal DS and store the address information corresponding to the word line WL1 as the bad page according to the defect level.

For example, the detector 400 may output the voltage VW1" or the time t" as the detection signal DS. The control logic circuit 220 may store the defect level according to the magnitude of the voltage VW1" or the defect level according to the time t". The control logic circuit 220 may store the address information corresponding to the word line WL1 as the bad page according to the defect level.

Alternatively, the detection signal DS may be output to the outside of the non-volatile memory device 120. The word line WL1 or the memory block BLKi of the corresponding non-volatile memory device 120 may be discarded according to the detection signal DS.

Although not shown, when the detector 400 detects the voltage VW1' or the time t', the third switch may be turned on and the fourth switch may be turned off. Alternately, when the detector 400 detects the voltage VW1" or the time t", the fourth switch may be turned on and the third switch may be turned off.

Figure 15:
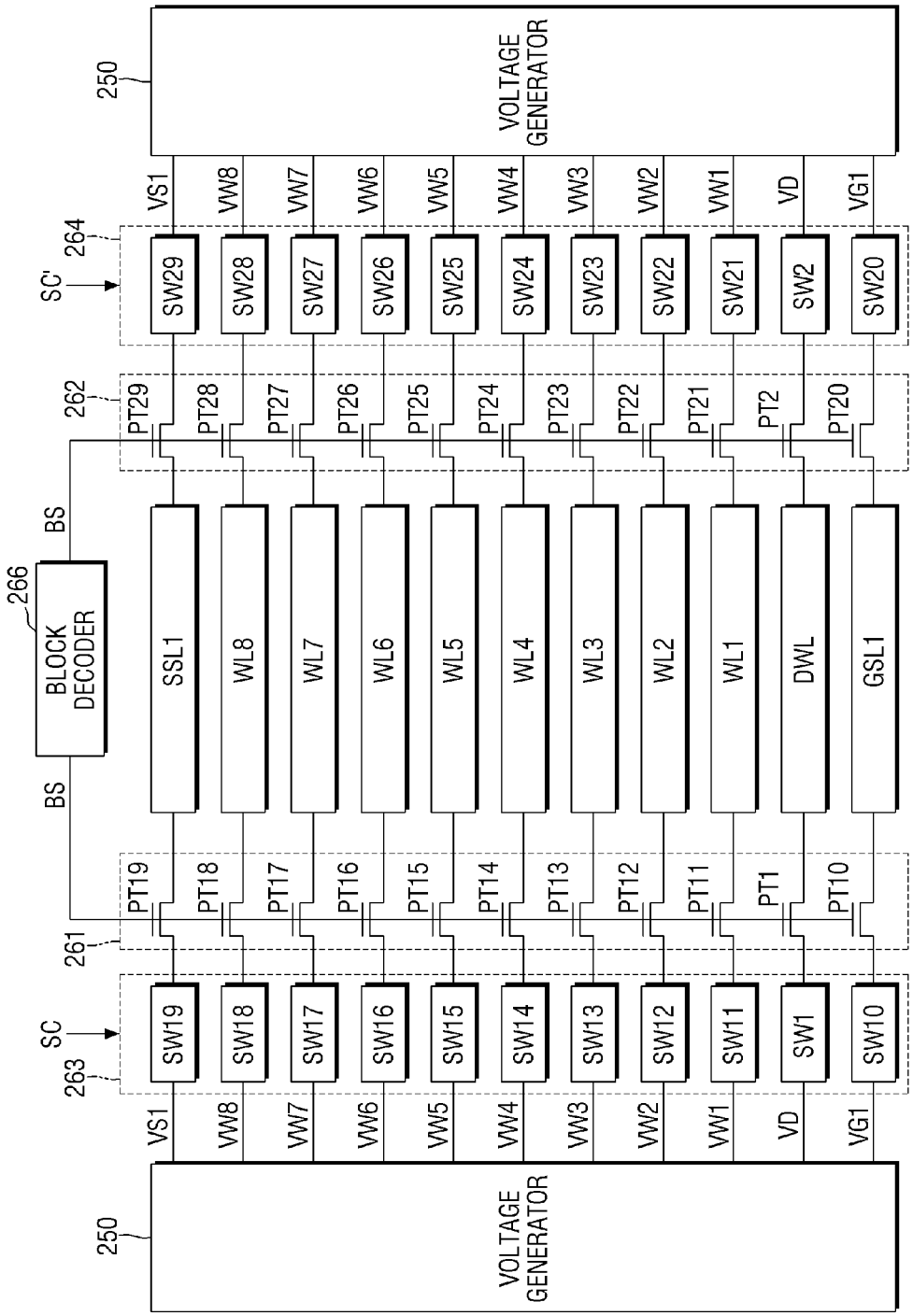
FIG. 15 is a view for describing the non-volatile memory device according to some exemplary embodiments.

FIG. 15 is a view for describing the non-volatile memory device according to some exemplary embodiments. For convenience of description, points different from those described in FIG. 4 will be mainly described.

Referring to FIG. 15, the NAND string may further include a dummy word line DWL. For example, the dummy word line DWL may be disposed between the ground selection line GSL1 and the word line WL1. For example, the dummy word line DWL may be disposed between the word lines WL1 to WL8 or between the word line WL8 and the string selection line SSL1. For example, the dummy word line DWL may be one of the word lines WL1 to WL8. The arrangement and number of dummy word lines DWL may be variously changed.

One side of the dummy word line DWL may receive a dummy word line voltage VD from the voltage generator 250 through a first pass transistor PT1 and a first switch SW1. The other side of the dummy word line DWL may receive the dummy word line voltage VD from the voltage generator 250 through a second pass transistor PT2 and a second switch SW2. The dummy word line DWL may be driven at both sides thereof by the first pass transistor PT1, the second pass transistor PT2, the first switch SW1, and the second switch SW2.

Dummy word lines DWL are patterned from the same conductive layer(s) forming such the word lines WL1 to WL8. For example, the dummy word lines DWL may be simultaneously formed with the word lines WL1 to WL8 with the same processes that deposit and pattern the conductive layer(s) forming the word lines WL1 to WL8. The dummy word lines DWL in non-volatile memory devices are not effective to cause transmission of data to external devices. For instance, the dummy word lines DWL may not be electrically connected to gates of memory cells, or if the dummy word lines DWL are electrically connected to gates of dummy memory cells, such dummy word lines DWL may not be activated or if activated, may not result in communication of any data in such dummy memory cells to a source external to the non-volatile memory device.

In some instances, a dummy word line DWL may be formed with a dummy memory cell in the same relationship as a word line and a normal memory cell, in other instances, dummy memory cells may not be formed with a dummy word line DWL. In some instances, a dummy word line DWL may be connected to a dummy memory cell and may also have voltages applied during access operations to the memory cell array. In some instances, a dummy memory cell associated with a dummy word line DWL may not be operative, but in other instances, a dummy memory cell may be activated by a dummy word line DWL, but may not have any "data" stored or read from a device external to the non-volatile memory device. For instance, data stored in a dummy memory cell electrically connected to a dummy word line DWL may not be transmitted outside of the memory cell array through selection signals provided by the column decoder, as is the case for normal memory cells. For instance, a dummy memory cell electrically connected to a dummy word line DWL may not have any connection to a bit line to transmit data there between as with normal memory cells.

Figure 16:
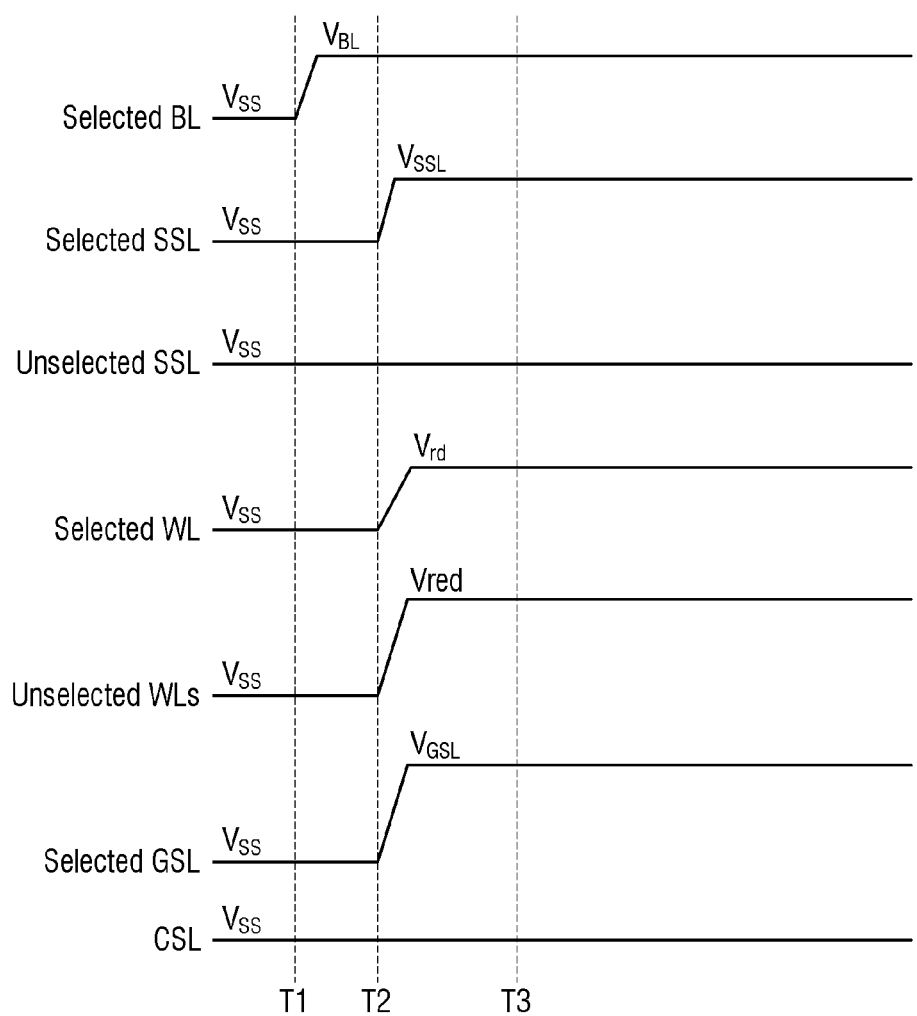
FIG. 16 is a view for describing a read operation of the non-volatile memory device in FIG. 4 according to example embodiments.

FIG. 16 is a view for describing a read operation of the non-volatile memory device of FIG. 4. It is assumed that the first pass circuit 261 and the second pass circuit 262 are turned on to read data of the selected memory block in FIG. 4.

Referring to FIG. 16, a selected bit line Selected BL is pre-charged with a bit line pre-charge voltage VBL to read data from a selected memory cell at a time point T1.

Thereafter, a string selection voltage VSSL and a ground selection voltage VGSL are respectively provided to a selected string selection line Selected SSL and a selected ground selection line Selected GSL at a time point T2. In addition, a selected read voltage Vrd is provided to a selected word line Selected WL, and an unselected read voltage Vred is provided to unselected word lines Unselected WLs. In addition, a common source line CSL and unselected string selection lines Unselected SSL may be maintained at a ground voltage Vss.

At this time, the corresponding operating voltage may be applied from at least one of both sides of each of the selected string selection line Selected SSL, the selected ground selection line Selected GSL, and the selected word line Selected WL according to the mode of the non-volatile memory device (the first to fourth modes of FIGS. 5 to 8).

Figure 17:
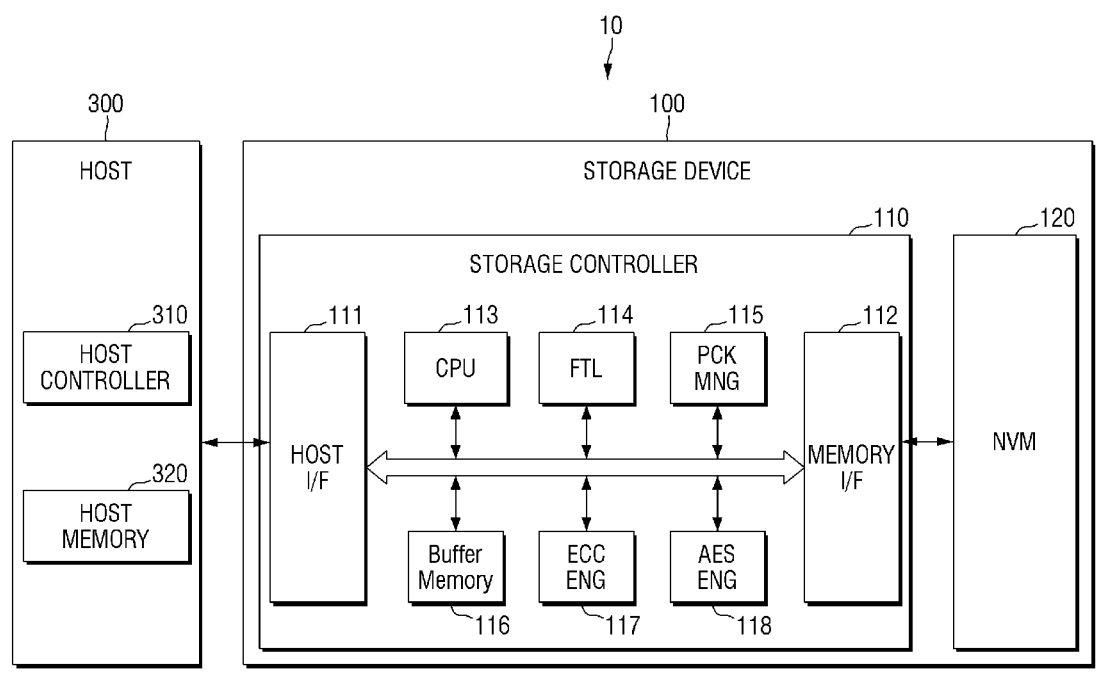
FIG. 17 is a block diagram showing a host-storage system according to some exemplary embodiments.

FIG. 17 is a block diagram showing a host-storage system according to some exemplary embodiments.

A host-storage system 10 may include a host 300 and a storage device 100. In addition, the storage device 100 may include a storage controller 110 and a non-volatile memory (NVM) device 120. Further, according to an exemplary embodiment of the present disclosure, the host 300 may include a host controller 310 and a host memory 320. The host memory 320 may function as a buffer memory for temporarily storing data to be transmitted to the storage device 100 or data transmitted from the storage device 100.

The storage device 100 may include storage media for storing data according to a request from the host 300. As an example, the storage device 100 may include at least one of a solid state drive (SSD), an embedded memory, and a detachable external memory. When the storage device 100 is the SSD, the storage device 100 may be a device conforming to a non-volatile memory express (NVMe) standard. When the storage device 100 is the embedded memory or the external memory, the storage device 100 may be a device conforming to a universal flash storage (UFS) or embedded multi-media card (eMMC) standard. Each of the host 300 and the storage device 100 may generate and transmit a packet according to an adopted standard protocol.

When the non-volatile memory device 120 of the storage device 100 includes a flash memory, the flash memory may include a two-dimensional (2D) NAND memory array or a 3D (or vertical) NAND (VNAND) memory array. As another example, the storage device 100 may include various other types of non-volatile memories. For example, the storage device 100 may include a magnetic RAM (MRAM), a spin-transfer torque MRAM, a conductive bridging RAM (CBRAM), a ferroelectric RAM (FeRAM), a phase RAM (PRAM), a resistive memory (Resistive RAM), and various other types of memories.

The non-volatile memory device 120 may be the non-volatile memory device 120 described above with reference to FIGS. 1 to 16.

According to an exemplary embodiment, the host controller 310 and the host memory 320 may be implemented as separate semiconductor chips. Alternatively, in some exemplary embodiments, the host controller 310 and the host memory 320 may be integrated on the same semiconductor chip. As an example, the host controller 310 may be any one of a plurality of modules provided in an application processor, and the application processor may be implemented as a system on chip (SoC). In addition, the host memory 320 may be an embedded memory provided in the application processor, or a non-volatile memory or a memory module disposed outside the application processor.

The host controller 310 may manage an operation of storing data (e.g., write data) of a buffer region of the host memory 320 in the non-volatile memory device 120 or storing data (e.g., read data) of the non-volatile memory device 120 in the buffer region.

The storage controller 110 may include a host interface 111, a memory interface 112, and a central processing unit (CPU) 113. In addition, the storage controller 110 may further include a flash translation layer (FTL) 114, a packet manager 115, a buffer memory 116, an error correction code (ECC) engine 117, and an advanced encryption standard (AES) engine 118. The storage controller 110 may further include a working memory (not shown) into which the FTL 114 is loaded, and it is possible to control data writing and reading operations for the non-volatile memory device 120 by the CPU 113 executing the FTL 114.

The host interface 111 may transmit/receive a packet to/from the host 300. The packet transmitted from the host 300 to the host interface 111 may include a command, data to be written to the non-volatile memory device 120, or the like, and the packet transmitted from the host interface 111 to the host 300 may include a response to the command, data read from the non-volatile memory device 120, or the like. The memory interface 112 may transmit the data to be written to the non-volatile memory device 120 to the non-volatile memory device 120 or receive the data read from the non-volatile memory device 120. The memory interface 112 may be implemented so as to comply with a standard protocol such as a toggle or an open NAND flash interface (ONFI).

The FTL 114 may perform various functions such as address mapping, wear-leveling, and garbage collection. The address mapping operation is an operation of changing a logical address received from the host 300 into a physical address used to actually store data in the non-volatile memory device 120. The wear-leveling is a technique for preventing excessive degradation of a specific block by allowing blocks in the non-volatile memory device 120 to be used uniformly, and for example, may be implemented by a firmware technology that balances erase counts of physical blocks. The garbage collection is a technique for securing usable capacity in the non-volatile memory device 120 by copying valid data of a block to a new block and then erasing an existing block.

The packet manager 115 may generate a packet according to a protocol of an interface negotiated with the host 300 or parse various pieces of information from a packet received from the host 300. In addition, the buffer memory 116 may temporarily store data to be written to the non-volatile memory device 120 or read from the non-volatile memory device 120. The buffer memory 116 may be provided in the storage controller 110, but may be disposed outside the storage controller 110.

The ECC engine 117 may perform an error detection and correction function on the read data read from the non-volatile memory device 120. More specifically, the ECC engine 117 may generate parity bits for write data to be written into the non-volatile memory device 120, and the generated parity bits may be stored in the non-volatile memory device 120 together with the write data. When reading data from the non-volatile memory device 120, the ECC engine 117 may correct an error in the read data using the parity bits read from the non-volatile memory device 120 together with the read data and output the read data in which the error has been corrected.

The AES engine 118 may perform at least one of an encryption operation and a decryption operation on data input to the storage controller 110 using a symmetric-key algorithm.

Embodiments of the present disclosure have been described with reference to the accompanying drawings, but the present disclosure is not limited to the embodiments and may be embodied in many different forms, and it will be understood by those of skill in the art that various changes in form and details may be made without departing from the spirit and scope of the present disclosure as set forth in the following claims. Therefore, it should be construed that the embodiments described above are exemplary in all respects and are not limiting.

What is claimed is:

1. A non-volatile memory device comprising:
a memory cell array including a plurality of memory blocks each including a plurality of memory cells respectively connected to a plurality of word lines;
a block decoder configured to generate a first block selection signal and select a first block of the plurality of memory blocks based on the first block selection signal;
a plurality of first pass transistors each connected to one side of one of the plurality of word lines of the first block;
a plurality of second pass transistors each connected to the other side of one of the plurality of word lines of the first block;
a voltage generator configured to generate a plurality of operating voltages and to apply the plurality of operating voltages to the memory cell array;
in response to a first switch control signal, a first switch circuit configured to connect the plurality of first pass transistors to the voltage generator and to apply a corresponding first voltage of the plurality of operating voltages to the one side of one of the plurality of word lines of the first block through a corresponding one of the plurality of first pass transistors; and
in response to a second switch control signal different from the first switch control signal, a second switch circuit configured to connect the plurality of second pass transistors to the voltage generator and to apply the corresponding first voltage to the other side of one of the plurality of word lines of the first block through a corresponding one of the plurality of second pass transistors,
wherein the one side of one of the plurality of word lines of the first block is directly connected to the other side of one of the plurality of word lines of the first block, in the same word line,
wherein the first switch circuit and the one side of one of the plurality of word lines of the first block are connected to each other through the corresponding one of the plurality of first pass transistors in response to the first block selection signal, and
wherein the second switch circuit and the other side of one of the plurality of word lines of the first block are connected to each other through the corresponding one of the plurality of second pass transistors in response to the first block selection signal.

2. The non-volatile memory device of claim 1, wherein the memory cell array further includes a plurality of ground selection transistors respectively connected to a plurality of ground selection lines and a plurality of string selection transistors respectively connected to a plurality of string selection lines, and
wherein the non-volatile memory device further comprises:
a plurality of third pass transistors each connected to one side of one of the plurality of ground selection lines and one side of one of the plurality of string selection lines;
a plurality of fourth pass transistors each connected to the other side of one of the plurality of ground selection lines and the other side of one of the plurality of string selection lines;
in response to the first switch control signal, a third switch circuit configured to:
connect the plurality of third pass transistors to the voltage generator,
apply a corresponding second voltage of the plurality of operating voltages to the one side of one of the plurality of ground selection lines through a corresponding one of the plurality of third pass transistors, and
apply a corresponding third voltage of the plurality of operating voltages to the one side of one of the plurality of string selection lines through a corresponding one of the plurality of third pass transistors; and
in response to the second switch control signal, a fourth switch circuit configured to:
connect the plurality of fourth pass transistors to the voltage generator,
apply the corresponding second voltage to the other side of one of the plurality of ground selection lines through a corresponding one of the plurality of fourth pass transistors, and
apply the corresponding third voltage to the other side of one of the plurality of string selection lines through a corresponding one of the plurality of fourth pass transistors.

3. The non-volatile memory device of claim 1, wherein the first switch circuit is configured to be enabled according to the first switch control signal such that the first switch circuit connects the plurality of first pass transistors to the voltage generator, and
wherein the second switch circuit is configured to be enabled according to the second switch control signal such that the second switch circuit connects the plurality of second pass transistors to the voltage generator.

4. The non-volatile memory device of claim 1, wherein the memory cell array further includes a plurality of dummy memory cells respectively connected to a plurality of dummy word lines, and
wherein the non-volatile memory device further comprises:
a plurality of third pass transistors each connected to one side of one of the plurality of dummy word lines;
a plurality of fourth pass transistors each connected to the other side of one of the plurality of dummy word lines;
in response to the first switch control signal, a third switch circuit configured to connect the plurality of third pass transistors to the voltage generator and to apply a corresponding second voltage of the plurality of operating voltages to the one side of one of the plurality of dummy word lines through a corresponding one of the plurality of third pass transistors; and
in response to the second switch control signal, a fourth switch circuit configured to connect the plurality of fourth pass transistors to the voltage generator and to apply the corresponding second voltage to the other side of one of the plurality of dummy word lines through a corresponding one of the plurality of fourth pass transistors.

5. The non-volatile memory device of claim 1, further comprising:
a detector having one side connected to a first node between the first switch circuit and one side of each of the plurality of word lines of the first block and the other side connected to a second node between the second switch circuit and the other side of each of the plurality of word lines of the first block and the detector configured to output a detection signal.

6. The non-volatile memory device of claim 5, wherein the detector is configured to:
   compare a voltage of the first node with a voltage of the second node when the first and second switch circuits are turned off, and
   output the detection signal based on a result of the comparison.

7. The non-volatile memory device of claim 5, wherein the detector is configured to:
   detect a first time at which a voltage of the first node reaches a predetermined voltage,
   compare a time at which a voltage of the first node reaches a set voltage with a time at which a voltage of the second node reaches the set voltage, and output the detection signal based on a result of the comparison.

8. The non-volatile memory device of claim 1, further comprising:
   a detector connected to any one of a first node between the first switch circuit and one side of each of the plurality of word lines of the first block and a second node between the second switch circuit and the other side of each of the plurality of word lines of the first block and the detector configured to output a detection signal.

9. The non-volatile memory device of claim 1, wherein the non-volatile memory device further includes a detector configured to:
   compare the number of first program loops for programming a first set of memory cells connected to a first word line of the plurality of word lines of the first block in a first mode in which the first switch circuit is enabled and the second switch circuit is disabled with the number of second program loops for programming the first set of memory cells in a second mode in which the first switch circuit is disabled and the second switch circuit is enabled, and
   output a detection signal based on a result of the comparison.

10. A non-volatile memory device comprising:
    a memory cell array including a plurality of memory cells respectively connected to a plurality of word lines;
    a voltage generator configured to generate a first operating voltage; and
    a switch circuit configured to apply the first operating voltage to any one of one side of one of the plurality of word lines and the other side of one of the plurality of word lines in a first mode, and apply the first operating voltage to one side of one of the plurality of word lines and the other side of one of the plurality of word lines in a second mode,
    wherein the one side of one of the plurality of word lines is directly connected to the other side of one of the plurality of word lines in the same word line, and
    wherein the switch circuit includes:
    a first switch circuit configured to apply the first operating voltage to the one side of one of the plurality of word lines in response to a first switch control signal, and
    a second switch circuit configured to apply the first operating voltage to the other side of one of the plurality of word lines in response to a second switch control signal different from the first switch control signal.

11. The non-volatile memory device of claim 10, wherein, in the first mode:
    the first switch circuit is enabled and the second switch circuit is disabled in response to the second switch control signal having a different logic level from that of the first switch control signal, and
    the first switch circuit is disabled and the second switch circuit is enabled in response to the second switch control signal having a different logic level from that of the first switch control signal, and
    wherein, in the second mode, the first and second switch circuits are enabled in response to the first switch control signal and the second switch control signal having the same logic level as that of the first switch control signal.

12. The non-volatile memory device of claim 11, further comprising:
    a plurality of first pass transistors each connected between one side of one of the plurality of word lines and the first switch circuit; and
    a plurality of second pass transistors each connected between the other side of one of the plurality of word lines and the second switch circuit.

13. The non-volatile memory device of claim 11, further comprising:
    a detector having one side connected to a first node between the first switch circuit and the one side of each of the plurality of word lines and the other side connected to a second node between the second switch circuit and the other side of each of the plurality of word lines and the detector configured to output a detection signal.

14. The non-volatile memory device of claim 11, further comprising:
    a detector connected to any one of a first node between the first switch circuit and one side of each of the plurality of word lines and a second node between the second switch circuit and the other side of each of the plurality of word lines and the detector configured to output a detection signal.

15. The non-volatile memory device of claim 11, wherein the non-volatile memory device further includes a detector configured, in the first mode, to:
    compare the number of first program loops for programming a first set of memory cells connected to a first word line of the plurality of word lines when the second switch circuit does not apply the first operating voltage to the other side of one of the plurality of word lines with the number of second program loops for programming the first set of memory cells when the first switch circuit does not apply the first operating voltage to the one side of one of the plurality of word lines, and
    output a detection signal based on a result of the comparison.

16. The non-volatile memory device of claim 10, wherein the memory cell array further includes a plurality of ground selection transistors respectively connected to a plurality of ground selection lines and a plurality of string selection transistors respectively connected to a plurality of string selection lines,
    wherein the voltage generator is configured to generate a second operating voltage applied to one of the plurality of ground selection lines and a third operating voltage applied to one of the string selection lines,
    wherein the switch circuit is configured to, in the first mode:

apply the second operating voltage to any one of one side of one of the plurality of ground selection lines and the other side of one of the plurality of ground selection lines, and apply the third operating voltage to any one of one side of one of the plurality of string selection lines and the other side of one of the plurality of string selection lines, and wherein the switch circuit is configured to, in the second mode:

apply the second operating voltage to one side of one of the plurality of ground selection lines and the other side of one of the plurality of ground selection lines, and apply the third operating voltage to one side of one of the plurality of string selection lines and the other side of one of the plurality of string selection lines.

\* \* \* \* \*